(12) United States Patent
Sato et al.

(10) Patent No.: US 8,510,693 B2
(45) Date of Patent: Aug. 13, 2013

(54) CHANGING ABSTRACTION LEVEL OF PORTION OF CIRCUIT DESIGN DURING VERIFICATION

(75) Inventors: Hiroyuki Sato, Kawasaki (JP); Hideo Kikuta, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/469,944

(22) Filed: May 11, 2012

(65) Prior Publication Data

US 2012/0317526 A1 Dec. 13, 2012

(30) Foreign Application Priority Data

Jun. 10, 2011 (JP) ................. 2011-130653

(51) Int. Cl.
*G06F 17/50* (2006.01)

(52) U.S. Cl.
USPC ............................ 716/106; 716/103; 716/111

(58) Field of Classification Search
USPC .......................... 716/103, 106, 111
See application file for complete search history.

(56) References Cited

U.S. PATENT DOCUMENTS

| | | | | |
|---|---|---|---|---|
| 5,555,201 A * | 9/1996 | Dangelo et al. | ............... | 716/102 |
| 6,208,955 B1 * | 3/2001 | Provan et al. | ................... | 703/20 |
| 6,249,901 B1 * | 6/2001 | Yuan et al. | ................... | 716/103 |
| 6,305,006 B1 * | 10/2001 | Markov | ......................... | 716/102 |
| 7,093,204 B2 * | 8/2006 | Oktem et al. | ................. | 716/103 |
| 7,228,262 B2 * | 6/2007 | Anzou et al. | ..................... | 703/14 |
| 7,299,432 B2 * | 11/2007 | Baumgartner et al. | ....... | 716/104 |
| 7,370,292 B2 * | 5/2008 | Baumgartner et al. | ....... | 716/112 |
| 7,937,673 B1 * | 5/2011 | Kurshan et al. | ............... | 716/102 |
| 8,122,398 B2 * | 2/2012 | Veller et al. | .................... | 716/103 |
| 8,245,166 B2 * | 8/2012 | Baumgartner et al. | ....... | 716/111 |
| 2002/0133325 A1 * | 9/2002 | Hoare et al. | .................... | 703/17 |
| 2003/0016770 A1 * | 1/2003 | Trans et al. | .................... | 375/346 |
| 2003/0125920 A1 * | 7/2003 | Matsuoka et al. | .............. | 703/15 |
| 2003/0182639 A1 * | 9/2003 | Lehner et al. | ..................... | 716/4 |
| 2003/0198471 A1 * | 10/2003 | Ovadia | ............................. | 398/47 |
| 2005/0015693 A1 | 1/2005 | Anzou et al. | | |
| 2007/0113215 A1 * | 5/2007 | Duan et al. | ..................... | 716/16 |
| 2007/0277144 A1 * | 11/2007 | Veller et al. | ..................... | 716/18 |
| 2009/0150136 A1 * | 6/2009 | Yang | ............................. | 703/13 |
| 2009/0164184 A1 * | 6/2009 | Vucurevich et al. | ............. | 703/6 |
| 2010/0049495 A1 * | 2/2010 | Francken et al. | ............... | 703/14 |
| 2011/0013650 A1 * | 1/2011 | McElvain | ..................... | 370/503 |
| 2012/0198405 A1 * | 8/2012 | Bhushan et al. | ............. | 716/112 |

FOREIGN PATENT DOCUMENTS

| | | |
|---|---|---|
| JP | 2000-348076 A | 12/2000 |
| JP | 2004-158034 A | 6/2004 |
| JP | 2005-037995 A | 2/2005 |

* cited by examiner

*Primary Examiner* — Naum Levin
(74) *Attorney, Agent, or Firm* — Arent Fox LLP

(57) ABSTRACT

A design verification method is disclosed. A computer searches for a path in accordance with a connection relationship between blocks by referring to a netlist stored in a storage part based on terminal information concerning a verification of a circuit which is formed by the blocks. Then, the computer changes an abstraction level of an operation of an out-of-path block which is a block outside the path and is searched for from the blocks described in the netlist.

8 Claims, 30 Drawing Sheets

42 NETLIST

```
I0 (IP IM oa) blockA     ~43a-2
I1 (oa oc OUT1) blockB
I2 (A B oc) blockC
I3 (IP IN od) blockD
I4 (od OUT2 OUT2) blockE Model blockA (in1 in2 out)
  aaaaaa
ends
Model blockB (in1 in2 out)
  bbbbbb
ends
Model blockC (in1 in2 out)
  cccccc
ends
Model blockD (in1 in2 out)   } 21d  } 2d
  dddddd
ends
Model blockE (in1 in2 out)   } 21e  } 2e
  eeeeee
ends
```

CONNECTION INFORMATION PART 43a

MODEL DESCRIPTION PART 43b 43b-2

41 VERIFICATION SPECIFICATION DATA

INPUT TERMINAL: IP, IM, A, B
OUTPUT TERMINAL: OUT1
VERIFICATION ITEM: OUTPUT LEVEL
VERIFICATION ACCURACY: LOW LEVEL

42 NETLIST

43a {
I0 (IP IM oa) blockA
I1 (oa oc OUT1) blockB
I2 (A B oc) blockC
I3 (IP IN od) blockD
I4 (od OUT2 OUT2) blockE 43b {
Model blockA (in1 in2 out)
　aaaaaa
ends
Model blockB (in1 in2 out)
　bbbbbb
ends
Model blockC (in1 in2 out)
　cccccc
ends
Model blockD (in1 in2 out)　⎫
　dddddd　　　　　　　　}21d　⎬2d
ends　　　　　　　　　　　　　⎭
Model blockE (in1 in2 out)　⎫
　eeeeee　　　　　　　　}21e　⎬2e
ends　　　　　　　　　　　　　⎭

FIG.8B

47 MODEL LIST

...
D1 : DETAILED MODEL
D2 : SIMPLIFIED MODEL
...
E1 : DETAILED MODEL
E2 : SIMPLIFIED MODEL
...

48a MODEL SELECTION RULE

USE MODEL OF HIGHEST LEVEL
OF ABSTRACTION FOR
OUT-OF-PATH BLOCK

49 MODEL DATABASE

...
D1
　d1d1d1
D2
　d2d2d2　～22d
...
E1
　e1e1e1
E2
　e2e2e2　～22e
...

42 NETLIST

CONNECTION INFORMATION PART 43a:
- I0 (IP IM oa) blockA
- I1 (oa oc OUT1) blockB
- I2 (A B oc) blockC
- I3 (IP IN od) blockD
- I4 (od OUT2 OUT2) blockE MODEL DESCRIPTION PART 43b:
- Model blockA (in1 in2 out)  } 21a  } 2a
  - aaaaaa
  - ends
- Model blockB (in1 in2 out)
  - bbbbbb
  - ends
- Model blockC (in1 in2 out)
  - cccccc
  - ends
- Model blockD (in1 in2 out)  } 21d  } 2d
  - dddddd
  - ends
- Model blockE (in1 in2 out)  } 21e  } 2e
  - eeeeee
  - ends

41 VERIFICATION SPECIFICATION DATA

INPUT TERMINAL: IP, IM, A, B
OUTPUT TERMINAL: OUT1
VERIFICATION ITEM: OUTPUT LEVEL
VERIFICATION ACCURACY: LOW LEVEL

42 NETLIST

43a:
I0 (IP IM oa) blockA
I1 (oa oc OUT1) blockB
I2 (A B oc) blockC
I3 (IP IN od) blockD
I4 (od OUT2 OUT2) blockE 43b:
Model blockA (in1 in2 out)  } 2a
  aaaaaa
ends
Model blockB (in1 in2 out)
  bbbbbb
ends
Model blockC (in1 in2 out)
  cccccc
ends
Model blockD (in1 in2 out)  } 2d
  dddddd
ends
Model blockE (in1 in2 out)  } 2e
  eeeeee
ends

47 MODEL LIST

A1 : OUTPUT LEVEL MODEL
A2 : CONNECTION CONFIRMATION MODEL
...
D1 : DETAILED MODEL
D2 : SIMPLIFIED MODEL
...
E1 : DETAILED MODEL
E2 : SIMPLIFIED MODEL
...

FIG.11C

44 IN-PATH SEARCH TREE

I0 (IP IM oa) blockA
I1 (oa oc OUT1) blockB
I2 (A B oc) blockC

45 IN-PATH BLOCK LIST blockA
blockB
blockC

46 OUT-OF-PATH BLOCK LIST blockD
blockE

FIG.12C
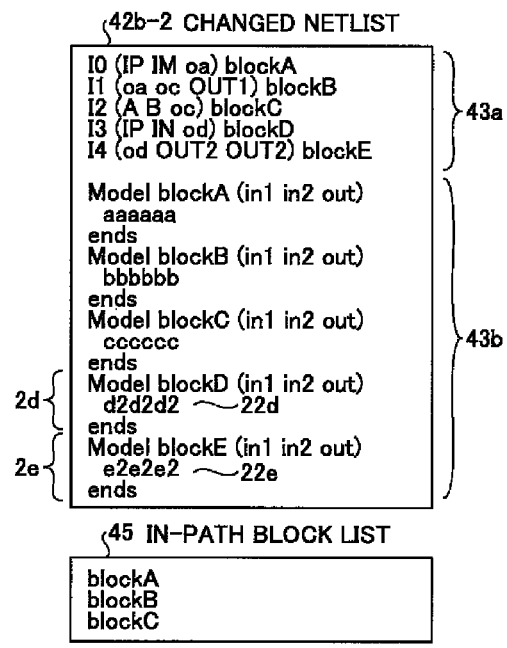
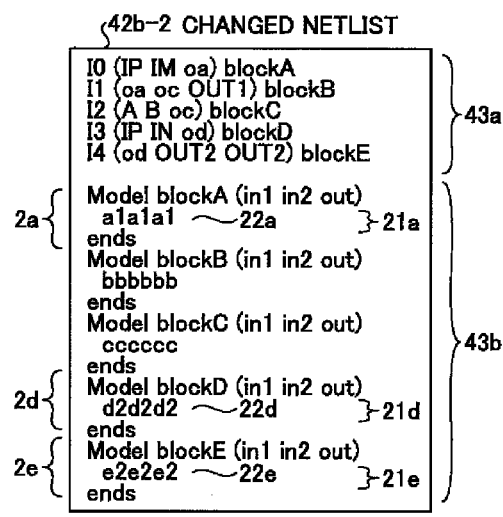

42 NETLIST

CONNECTION INFORMATION PART 43a:
```
I0 (IP IM oa) blockA
I1 (oa oc OUT1) blockB
I2 (A B oc) blockC
I3 (IP IN od) blockD
I4 (od OUT2 OUT2) blockE
```

MODEL DESCRIPTION PART 43b:
```
Model blockA (in1 in2 out)
  aaaaaa
ends
Model blockB (in1 in2 out)
  bbbbbb
ends
Model blockC (in1 in2 out)
  cccccc
ends
Model blockD (in1 in2 out)   } 2d
  dddddd
ends
Model blockE (in1 in2 out)   } 2e
  eeeeee
ends
```

41 VERIFICATION SPECIFICATION DATA

INPUT TERMINAL: IP, IM, A, B
OUTPUT TERMINAL: OUT1
VERIFICATION ITEM: OUTPUT LEVEL
VERIFICATION ACCURACY: LOW LEVEL

42 NETLIST

43a:
```
I0 (IP IM oa) blockA
I1 (oa oc OUT1) blockB
I2 (A B oc) blockC           —53
I3 (IP IN od) blockD         —54
I4 (od OUT2 OUT2) blockE
```

43b:
```
Model blockA (in1 in2 out)
   aaaaaa
ends
Model blockB (in1 in2 out)
   bbbbbb
ends
Model blockC (in1 in2 out)
   cccccc
ends
Model blockD (in1 in2 out)  ⎫
   dddddd                    ⎬ 2d
ends                         ⎭
Model blockE (in1 in2 out)  ⎫
   eeeeee                    ⎬ 2e
ends                         ⎭
```

48c MODEL SELECTION RULE

DELETE OUT-OF-PATH
BLOCK FROM NETLIST

CHANGING ABSTRACTION LEVEL OF PORTION OF CIRCUIT DESIGN DURING VERIFICATION

CROSS-REFERENCE TO RELATED APPLICATIONS

This patent application is based upon and claims the benefit of priority of the prior Japanese Patent Application No. 2011-130653 filed on Jun. 10, 2011, the entire contents of which are incorporated herein by reference.

FIELD

The embodiment discussed herein is related to a technology for verifying a circuit.

BACKGROUND

Conventionally, functions and features of a large-scale circuit are verified by simulating a designed circuit. Verification using a simulation is effective to extract failures earlier in a circuit design stage. However, a process time for the verification is a problem. Thus, in order to reduce calculation points and nodes which become factors increasing the time of the simulation, a designer has changed an abstraction level of a model for each of blocks forming a circuit, based on experiences of a circuit design and verification of the designer concerning verification contents and blocks related to the verification contents.

In this verification circumstance, as a technology for changing the abstraction level of the model of a circuit block, a part of a verification target is specified at a given verification level based on a simulation result of the highest verification level. As another technology, for a portion possible to be replaced with a function description in circuit element information in input data, the function description is selected from a function description database to replace the portion. As a further technology, a timing of changing the abstraction level of a circuit is determined by analyzing the circuit in a semiconductor integrated circuit based on a circuit database. At the determined timing, a simulation is conducted by switching to the entire circuit simulation or to a partial circuit simulation in which a portion, which is not needed to be analyzed, is regarded as a black box.

In the simulation, an operation of the circuit is verified in accordance with the verification contents. Depending on the verification contents, a path in which a signal propagates in the circuit becomes different. Also, recently, when the circuit becomes a larger scale, the path becomes more complicated.

In the above described conventional technologies, in order to reduce a process workload of the simulation, a verification target is determined beforehand to change a detail level or the abstraction level, or the number of elements is reduced beforehand by changing to an equivalent circuit based on an estimation result of availability of the simulation.

Therefore, in the path in the circuit, when the simulation is executed in accordance with the verification contents, there is a problem in which a block to be verified with a low abstraction level of a model may be verified with a high abstraction level. Also, a block to be verified with a high abstraction level of the model may be verified with a low abstraction level.

PATENT DOCUMENTS

Japanese Laid-open Patent Publication No. 2000-348076
Japanese Laid-open Patent Publication No. 2004-158034
Japanese Laid-open Patent Publication No. 2005-37995

SUMMARY

According to one aspect of the embodiment, there is provided a design verification method performed in a computer, the method including: searching for, by the computer, a path in accordance with a connection relationship between blocks by referring to a netlist stored in a storage part based on terminal information concerning a verification of a circuit which is formed by the blocks; and changing, by the computer, an abstraction level of an operation of an out-of-path block which is a block outside the path and is searched for from the blocks described in the netlist.

According to other aspects of the embodiment, there may be provided a non-transitory computer-readable recording medium storing a program for causing a computer to perform a design verification process, and a design verification apparatus which performs the design verification process.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 6A and FIG. 6B are diagrams illustrating examples of input data according to an embodiment 1;

FIG. 7B illustrates data referred to in the abstraction level selection process in the embodiment 1 (part 1)

FIG. 8B illustrates data referred to in the abstraction level selection process in the embodiment 1 (part 2)

FIG. 10A and FIG. 10B are diagrams illustrating examples of input data according to the embodiment 2;

FIG. 11B is a diagram illustrating examples of input data for the abstraction level selection process in the embodiment 2 in FIG. 11A (part 1), and FIG. 11C is a diagram illustrating data examples generated in the abstraction level selection process in the embodiment 2 in FIG. 11A (part 1);

FIG. 12C is a diagram illustrating data examples generated in the abstraction level selection process in the embodiment 2 in FIG. 12A (part 2);

FIG. 14A and FIG. 14B are diagrams illustrating examples of the input data according to an embodiment 3;

FIG. 15B illustrates data referred to in the abstraction level selection process in the embodiment 1.

DESCRIPTION OF EMBODIMENTS

In the following, embodiments of the present invention will be described with reference to the accompanying drawings. In a design verification apparatus 100 (FIG. 1) according to the embodiment, a path propagating a signal concerning a circuit operation is searched before a simulation is executed. For multiple blocks forming a circuit, a model is selected for either a block in the searched path (hereinafter, called an "in-path block") or a block outside the searched path (hereinafter, called an "out-of-path block"), or models are respectively selected for both the in-path block and the out-of-path block. Thus, circuit verification is properly carried out in the embodiment.

Figure 1:
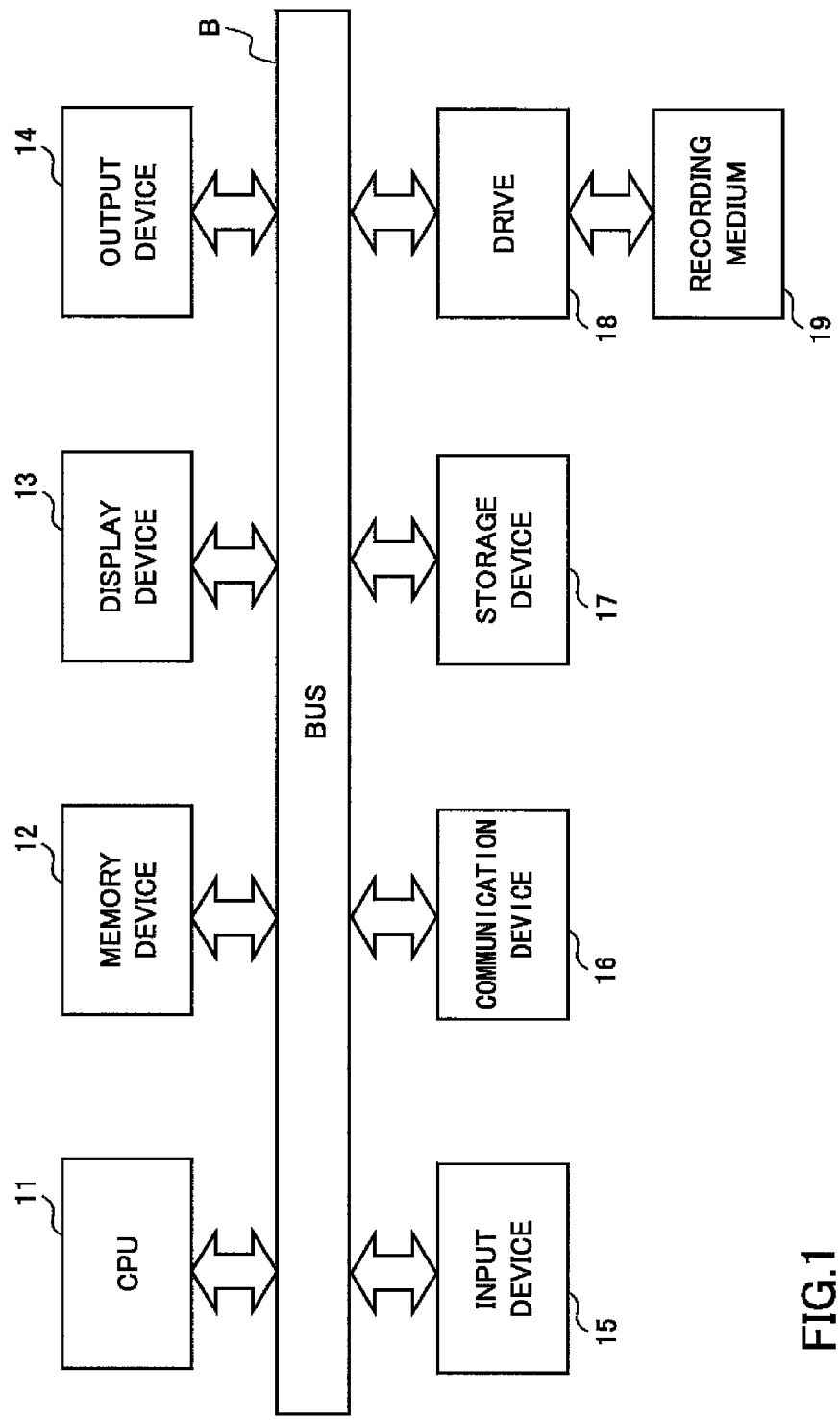
FIG. 1 is a diagram illustrating a hardware configuration of a design verification apparatus.

The design verification apparatus 100 according to the embodiment may include a hardware configuration as illustrated in FIG. 1. FIG. 1 is a diagram illustrating the hardware configuration of the design verification apparatus. In FIG. 1, the design verification apparatus 100 is controlled by a computer, and includes a Central Processing Unit (CPU) 11, a memory device 12, a display device 13, an output device 14, an input device 15, a communication device 16, a storage device 17, and a drive 18, which are connected via a system bus B.

The CPU 11 controls the design verification apparatus 100 in accordance with a program stored in the memory device 12. A Random Access Memory (RAM), a Read-Only Memory (ROM), or the like may be used as the memory device 12, and stores the program executed by the CPU 11, data for a process performed by the CPU 11, and data acquired in the process which is performed by the CPU 11. Also, a part of an area in the memory device 12 may be assigned as a working area to be used for the process performed by the CPU 11.

The display device 13 displays various information items under a control of the CPU 11. The output device 14 includes a printer or the like, and is used to output various information items in response to an indication of a user. The input device 15 includes a mouse, a keyboard, and the like, and is used by a user to input various information items for the process performed by the design verification apparatus 100.

The communication device 16 is connected to the Internet, a Local Area Network (LAN), or the like, and is used to control communications with an external apparatus. The storage device 17 includes a hard disk unit, and stores the program for performing various processes, data, and the like.

The program for realizing the processes conducted by the design verification apparatus 100 may be provided by a recording medium 19 such as a Compact Disc Read-Only Memory (CD-ROM) or the like. That is, when the recording medium 19 storing the program is set into the drive 18, the program is read out by the drive 18 from the recording medium 19, and is installed into the storage device 17 via the system bus B. Thus, when the program is activated, the CPU 11 starts the process in accordance with the program installed in the storage device 17. The recording medium 19 is not limited to the CD-ROM to store the program. Any of sa non-transitory (or tangible) computer-readable recording medium may be used as the recording medium 19. As the computer-readable recording medium, a Digital Versatile Disk (DVD), a portable recording medium such as a Universal Serial Bus (USB) memory, a semiconductor memory such as a flash memory, and the like may be used as well as the CD-ROM.

Also, the program realizing the process in the design verification apparatus 100 may be provided from the external apparatus through the communication device 16.

Figure 2:
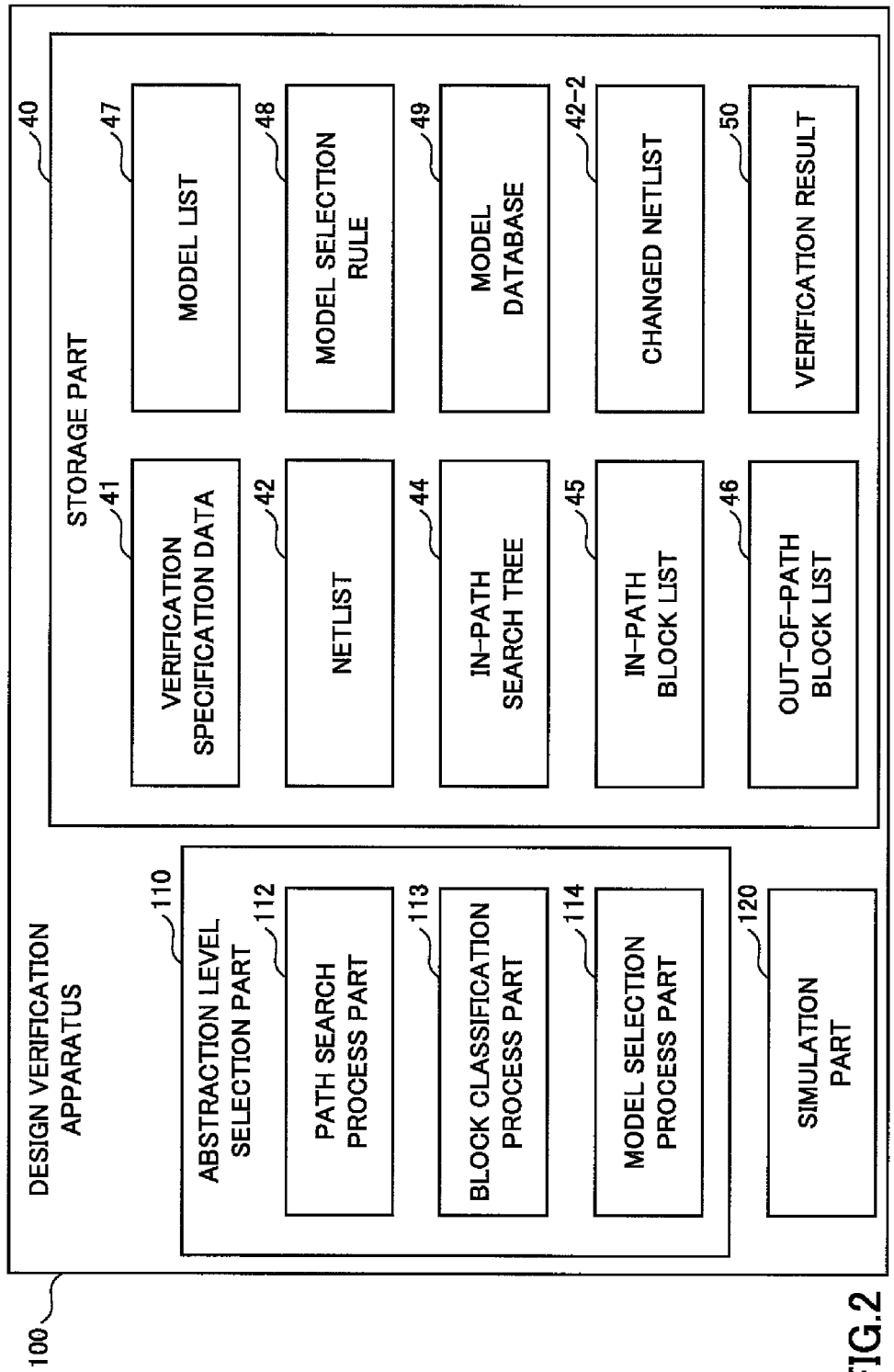
FIG. 2 is a diagram illustrating a functional configuration example of the design verification apparatus.

FIG. 2 is a diagram illustrating a functional configuration example of the design verification apparatus 100. The design verification apparatus 100 illustrated in FIG. 2 mainly includes an abstraction level selection part 110, a simulation part 120, and a storage part 40.

The abstraction level selection part 110 and the simulation part 120 are realized by processes by the CPU 11 executing respective programs.

The storage part 40 may be formed by the memory device 12 or/and the storage device 17. The storage part 40 may further include another computer-readable recording medium, another portable recording medium being detachable to the design verification apparatus 100, an external storage device being accessible through the communication device 16, or the like.

The storage part 40 stores verification specification data 41, a netlist 42, an in-path search tree 44, an in-path block list 45, an out-of-path block list 46, a model list 47, a model selection rule 48, a model database 49, a changed netlist 42-2, a verification result 50, and the like, which are related to the processes performed by the design verification apparatus 100.

The verification specification data 41 includes verification contents for verifying a designed circuit. In the verification specification data 41, input terminals, output terminals, verification items, verification accuracy levels, and the like are defined. The input terminals and the output terminals are respectively indicated by input terminal identification information for identifying each of the input terminals, and output terminal identification information for identifying each of the output terminals. The input terminal identification information and the output terminal identification information may be regarded as terminal information. The verification specification data 41 are created for each of verification purposes. Thus, multiple sets of the verification specification data 41 may exist in the storage part 40.

The simulation is performed by the simulation part 120 in accordance with the verification specification data 41. A designed circuit is verified with a verification accuracy level with respect to the verification items in a path from the input terminal to the output terminal which are indicated in the verification specification data 41.

The netlist 42 is stored in the storage part 40 as data including connection information which describes a connection relationship between multiple blocks forming the circuit, and descriptions of models respective to the blocks.

The in-path search tree 44 is stored in the storage part 40 as data generated in a path search process performed by the abstraction level selection part 110 based on the verification specification data 41. The in-path search tree 44 represents the connection relationship in the path which is searched by referring to the verification specification data 41 and the netlist 42.

The in-path block list 45 is stored in the storage part 40 as data indicating a list of blocks included in the in-path search tree 44. In the in-path block list 45, each of the blocks is indicated by identification information of the blocks (block identification information).

The out-of-path block list 46 is stored in the storage part 40 as data indicating a list of blocks outside the path, the blocks specified by referring to the in-path block list 45 and the netlist 42. In the out-of-path block list 46, each of the blocks is indicated by the block identification information of the blocks (block identification information).

The model list 47 is stored in the storage part 40 as data indicating a list of model identification information for each abstraction level, for models having different abstraction levels.

The model selection rule 48 is stored in the storage part 40 as data indicating the abstraction levels with respect to the in-path blocks and/or the out-of-path blocks and specifying a rule for selecting the model.

The model database 49 is stored in the storage part 40 and is used to store and manage entities of the models corresponding to the abstraction levels for each of the blocks forming the circuit. The entities of the models may be operation description data in which each operation of the models corresponding to the abstraction levels is described in a hardware description language. The model database 49 stores and manages the multiple models having the different abstraction levels respective to the verification accuracy levels for each of the blocks. The terminal information may be the same for the models prepared for each of the blocks.

The multiple models having the different abstraction levels include a detailed model and a simplified model. The detailed model of a low abstraction level may be represented as a model which is described in Verilog-A language and includes information of a time change, a nonlinear state, a transient state, an analog operation, and the like. The simplified model of a high abstraction level may be represented as a model which is described in Verilog-D or described as a cell specifying the terminal information alone, and includes information of the time change, a linear state, and the like. Thus, the multiple models having the different abstractions correspond to operation description data created beforehand respective to various verification specifications.

The changed netlist 42-2 is stored in the storage part 40 as a state after the netlist 42 is changed by the abstraction selection part 110 using the models respective to the verification items and verification accuracy levels defined in the verification specification data 41.

The verification result 50 is stored in the storage part 40 as data indicating a result from simulating an operation of the circuit by the simulation part 120 using the changed netlist 42-2.

The abstraction level selection part 110 searches for the path from the input terminal to the output terminal, which are defined in the verification specification data 41 being stored in the storage part 40 and indicating the verification contents for verifying the designed circuit, and selects the abstraction levels of the in-path block and/or the out-of-the path block. The abstraction level selection part 110 further includes a path search process part 112, a block classification process part 113, and a model selection process part 114.

The path search process part 112 searches for the path from the input terminal to the output terminal, which are defined in the verification specification data 41, by referring to the netlist 42, and generates the in-path search tree 44. The in-path search tree 44, which is generated by the path search process part 112, is stored in the storage part 40. By searching for the path from the input terminal to the output terminal, which are defined in the verification specification data 41, it is possible to select the blocks related to the verification contents.

In the path search process performed by the path search process part 112, all paths from the input terminal are searched for, and a search from the same block being passed once is terminated. One or more output terminals are defined from a search result acquired by the path search process. It is possible to determine all paths between the input terminal and the output terminal.

The block classification process part 113 classifies the multiple blocks forming the circuit into the in-path blocks and the out-of-path blocks based on the verification specification data 41 by referring to the in-path search tree 44 and further referring to the netlist 42.

The block classification process part 113 generates the in-path block list 45 listing the in-path blocks with the block identification information, by referring to the in-path search tree 44. The in-path block list 45 generated by the block classification process part 113 is stored in the storage part 40.

Also, the block classification process part 113 generates the out-of-path block list 46 by using the in-path block list 45 and the netlist 42. The out-of-path block list 46 generated by the block classification process part 113 is stored in the storage part 40.

The model selection process part 114 selects the abstraction levels of the in-path blocks and/or the out-of-path blocks. The model selection process part 114 changes a respective model in the netlist 42 with a model corresponding to the abstraction level according to the model selection rule 48 for the in-path block and/or the out-of-path block, thereby the changed netlist 42-2 is generated. The changed netlist 42-2 is stored in the storage part 40.

The model selection process part 114 may change the model describing the operation for each of the out-of-path blocks with the detailed model of the high abstraction level. Alternatively, the model selection process part 114 may delete one or more of the out-of-path blocks. The model selection process part 114 may change the model describing the operation for each of the in-path blocks with the detailed model of the low abstraction level.

As a change example, in a case in that the time constancy is indicated or the transient state is ignored by the verification items, it is possible to change to the simplified model. Also, in a case of a linear operation (in a case of a uniformed output for an input), it is possible to change to the simplified model.

The simulation part 120 verifies the operation of the circuit by using the changed netlist 42-2 stored in the storage part 40. The verification result 50 is generated by the simulation, and is stored in the storage part 40. When the abstraction level selection part 110 does not change the netlist 42, that is, when the changed netlist 42-2 is not generated, the simulation part 120 carries out the simulation by using the netlist 42.

Figure 3:
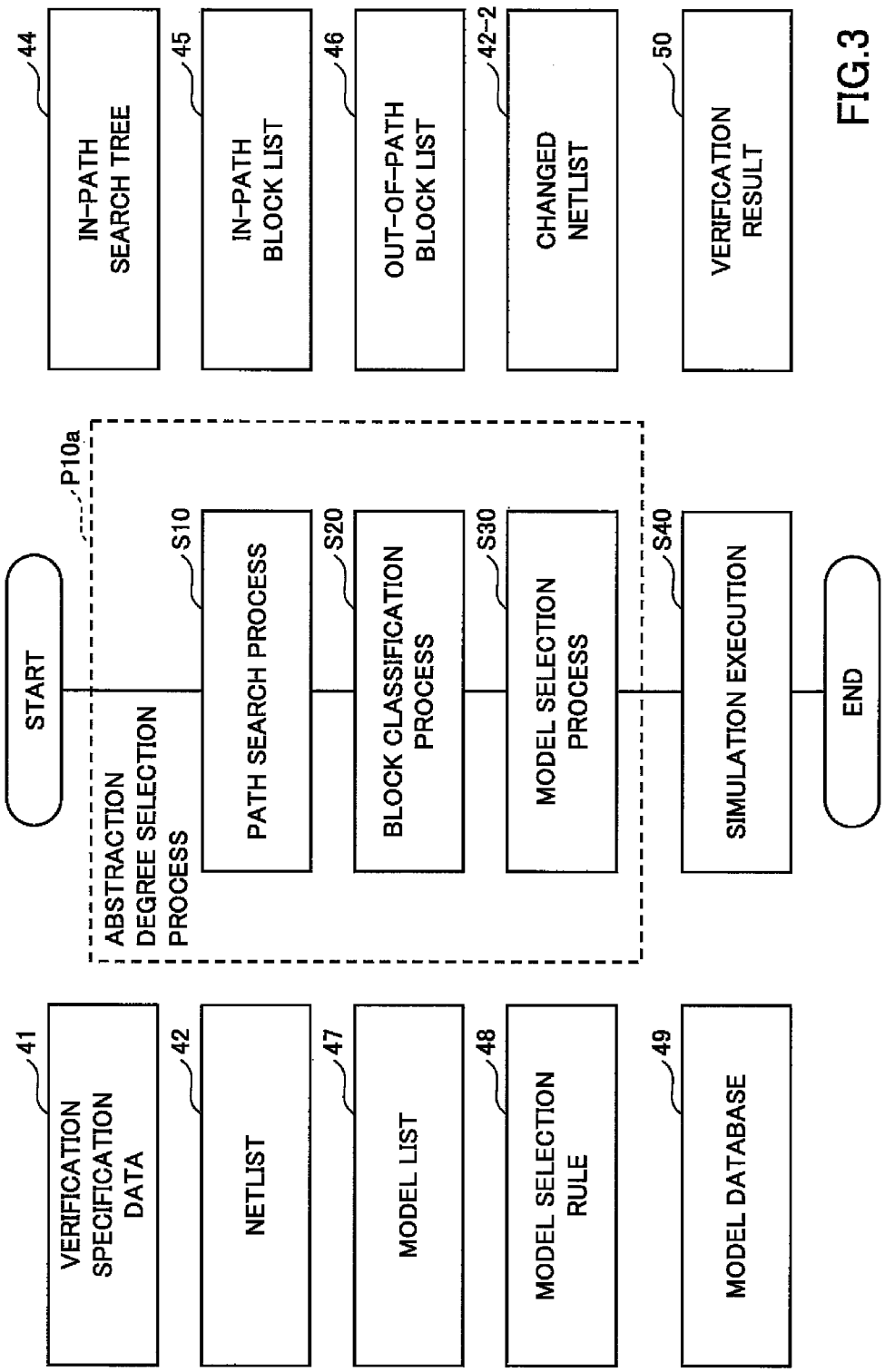
FIG. 3 is a flowchart for briefly explaining the entire process performed in the design verification apparatus.

FIG. 3 is a flowchart for briefly explaining the entire process performed in the design verification apparatus 100. In FIG. 3, steps S10 to S30 correspond to an abstraction level selection process P10a performed by the abstraction level selection part 110. The path search process part 112 performs the path search process by using the verification specification data 41 and the netlist 42 which are stored in the storage part 40 (S10).

Since the verification specification data 41 are created beforehand for each of the verification contents corresponding to the verification purposes, in a case of multiple verification contents, multiple sets of the verification specification data 41 respective to the verification contents may exist. In this case, the path search process is performed by using the verification specification data 41 indicated by a user (who may be a circuit designer).

In the path search process of step S10, the in-path search tree 44 is generated and is stored in the storage part 40.

Next, the block classification process part 113 performs a block classification process for classifying the blocks forming the circuit into the in-path blocks and the out-of-path blocks by using the in-path search tree 44 and the netlist 42 which are stored in the storage part 40 (step S20).

In step S20, the block classification process part 113 extracts the block identification information from the in-path search tree 44, generates the in-path block list 45 listing the in-path blocks with the block identification information, and stores the in-path block list 45. Also, the block classification process part 113 extracts the block identification information of blocks which are not included in the in-path block list 45, by using the in-path block list 45 and the netlist 42, generates the out-of-path block list 46 listing the out-of-path blocks, and stores the out-of-path block list 46 in the storage part 40.

The model selection process part 114 acquires the model identification information corresponding to the abstraction level in accordance with the verification specification data 41 and the model selection rule 48 from the model list 47 for each of the in-path blocks and/or the out-of-path blocks, acquires the operation description data specified by the model identification information from the model database 49, and changes the netlist 42 (step S30). The changed netlist 42-2, in which the netlist 42 is changed, is stored in the storage part 40.

After that, the simulation is carried out by the simulation part 120 using the changed netlist 42-2 (step S40). The verification result 50 by the simulation is stored in the storage part 40.

It is possible to perform the simulation using the changed netlist 42-2 faster than a case of using the netlist 42 in which the abstraction level is not changed. Also, by performing the simulation with the model of the abstraction level according to the verification specification data 41, it is possible to acquire the verification result 50 from adequately verifying the operation of the circuit.

Figure 4A:
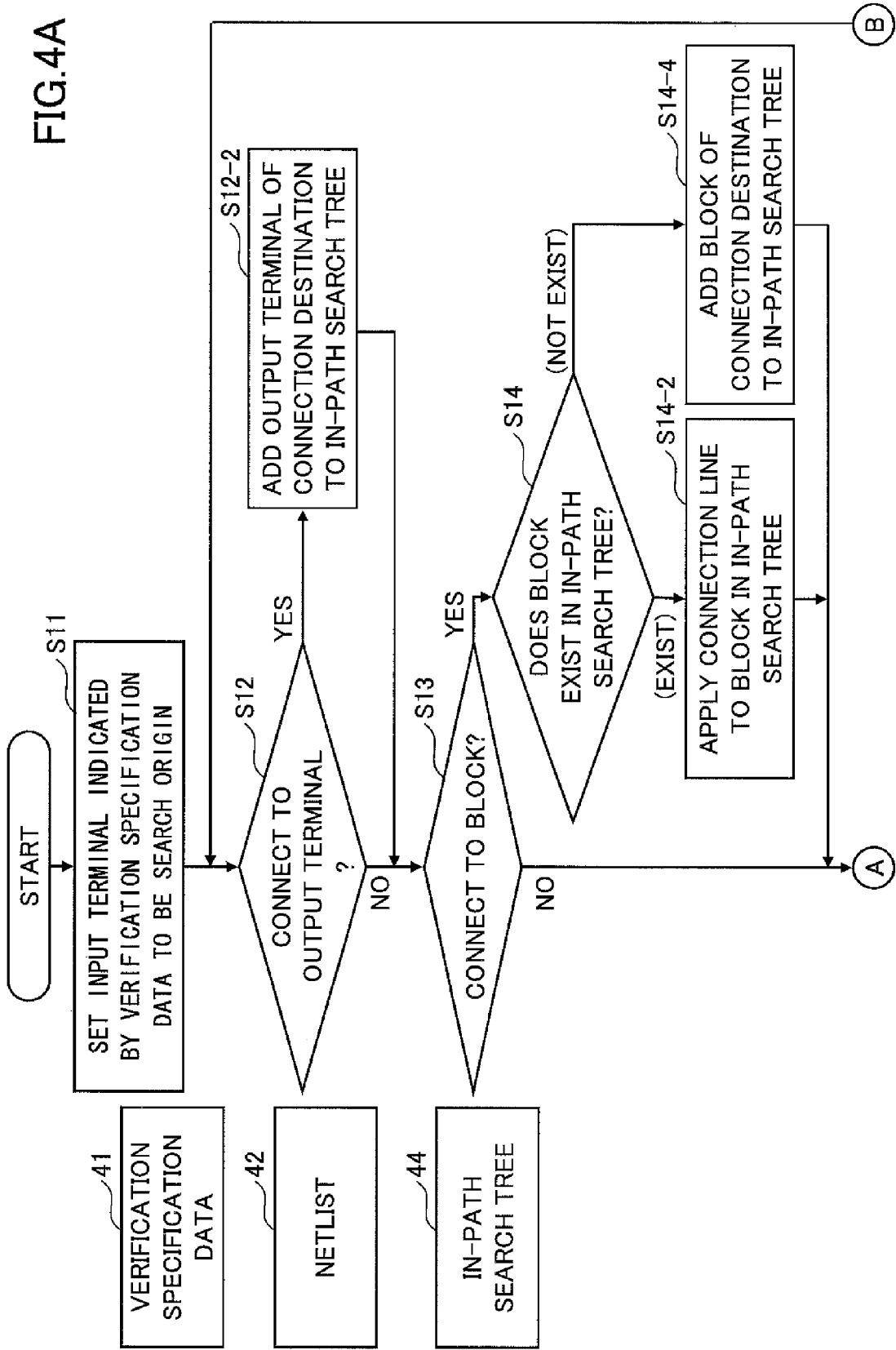
FIG. 4A and FIG. 4B illustrate a flowchart for explaining the path search process in step S10 in FIG. 3.
Figure 4B:
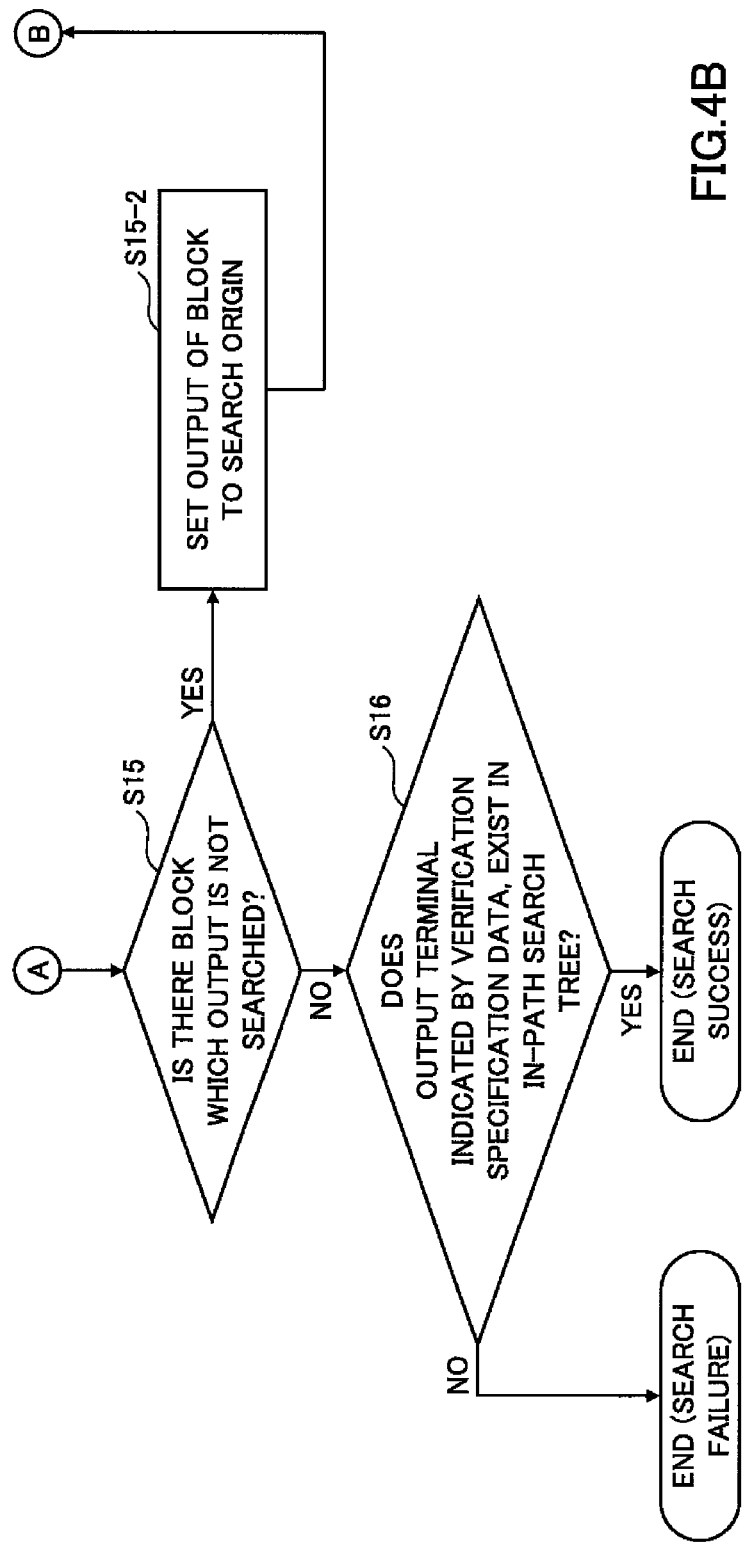

Next, the path search process of step S10 in the abstraction level selection process P10a will be described with reference to FIG. 4A and FIG. 4B. FIG. 4A and FIG. 4B illustrates a flowchart for explaining the path search process in step S10 in FIG. 3. In FIG. 4A, the path search process part 112 sets the input terminal defined in the verification specification data 41 to be a search starting point (step S11).

The path search process part 112 determines, by referring to the netlist 42, whether or not the connection information from the search starting point indicates a connection to the output terminal (step S12). When the output terminal is connected, the path search process part 112 adds the output terminal of a connection destination to the in-path search tree 44 (step S12-2), and advances to step S13. In the in-path search tree 44, the output terminal identification information of the output terminal is added as the connection destination for the input terminal identification information of the input terminal.

On the other hand, in step S12, when the connection information does not indicate the connection to the output terminal, the path search process part 112 determines whether or not the connection information from the search starting point indicates a connection to the block (step S13). In the connection information, when the block is not indicated as the connection destination, the path search process part 112 advances to step S15 (FIG. 4B).

On the other hand, in step S13, when the connection information indicates that the block is connected, the path search process part 112 further determines whether or not the block (that is, the block identification information) exists in the in-path search tree 44 (step S14). When the block (the block identification information) exists, the path search process part 112 applies a connection line to the block which has been added in the in-path search tree 44 (step S14-2), and advances to step S15 (FIG. 4B). In in-path search tree 44, the connection information is added to indicate the connection relationship with the search starting point by corresponding to the block identification information which has been added.

In step S14, when the block (block identification information) does not exist in the in-path search tree 44, the path search process part 112 adds the block (block identification information) of the connection destination to the in-path search tree 44 (step S14-4), and advances to step S15 (FIG. 4B).

Referring to FIG. 4B, the path search process part 112 determines whether or not there is a block which has not been searched in the in-path search tree 44 (step S15). That is, in the in-path search tree 44, the path search process part 112 determines whether or not there is the block identification information, for which the connection information does not exist.

In step S15, when it is determined that there is a block for which the connection information does not exist, the path search process part 112 sets an output of the block to be the search starting point (step S15-2). The path search process part 112 acquires, by referring to the netlist 42, the output terminal (output terminal identification information) outputting a signal from the block in which the output is not searched, and sets the output terminal identification information to be the search starting point (step S15-2). After that, the path search process part 112 goes back to step S12, and repeats the above described processes.

On the other hand, when it is determined that there is not a block for which the connection information does not exist, the path search process part 112 determines whether or not the output terminal defined in the verification specification data 41 exists in the in-path search tree 44 (step S16). When the output terminal exists in the in-path search tree 44, the path search process part 112 sets a search success to a result of the path search process, and terminates the path search process. On the other hand, when the output terminal does not exist in the in-path search tree 44, the path search process part 112 sets a search failure to the result of the path search process, and terminates the path search process.

In the abstraction level selection process, when the path search process is terminated with the search success, a further process is continued by a block classification process part 113. On the other hand, when the path search process is terminated with the search failure, the abstraction level selection process is terminated. The display device 13 may display data indicating that the path search is failed. Thus, the designer may re-design the circuit.

In the following, embodiments of the abstraction level selection process performed by using the in-path search tree 44 acquired in the path search process will be described in detail by using an example of a target circuits illustrated in FIG. 5.

Figure 5:
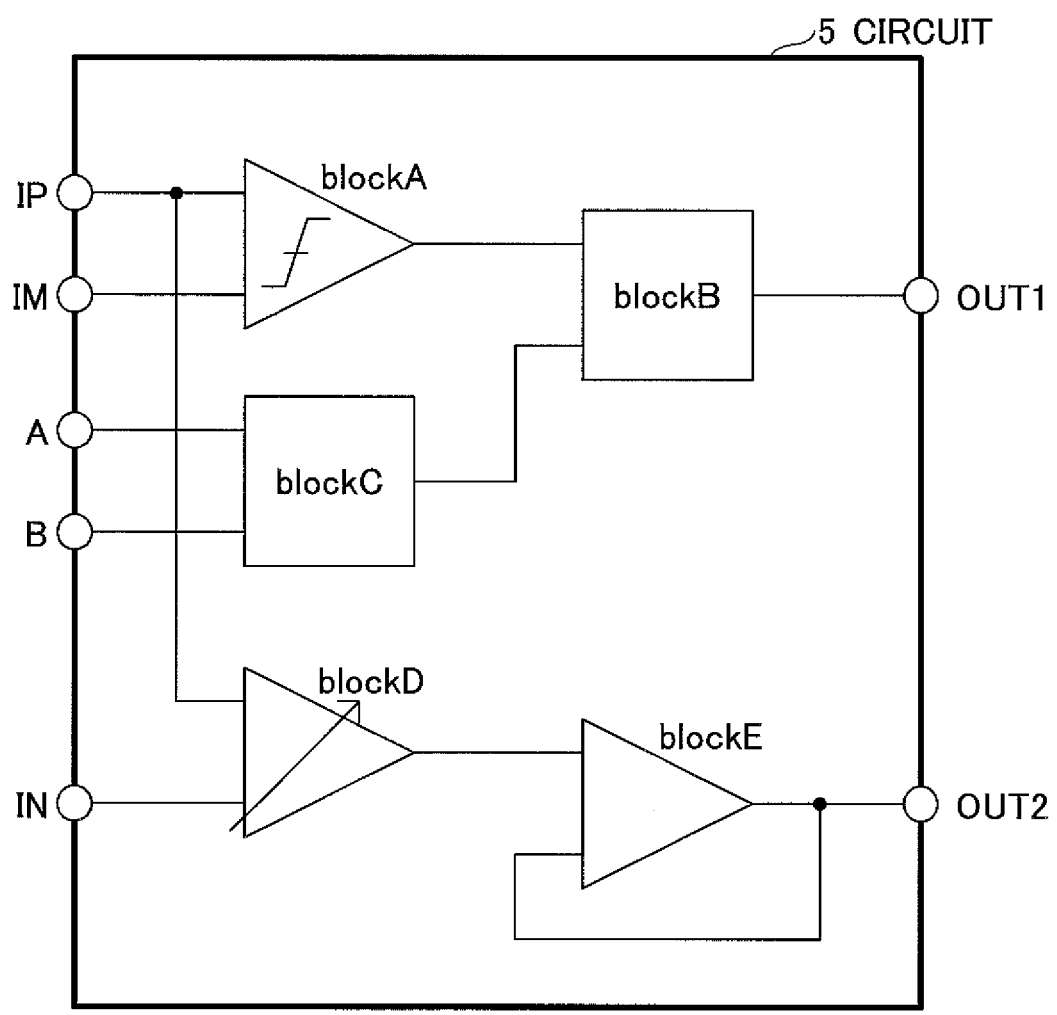
FIG. 5 is a diagram illustrating a configuration example of a target circuit.

FIG. 5 is a diagram illustrating a configuration example of the target circuits. A circuit 5 illustrated in FIG. 5 includes input terminals "IP", "IM", "A", "B", and "IN", and output terminals "OUT1" and "OUT2". "IP", "IM", "A", "B", and "IN" will be referred to as the input terminal identification information in the embodiments described below. Also, "OUT1" and "OUT2" will be referred to as the output terminal identification information in the embodiment described below.

Also, the circuit 5 may be formed by blocks "blockA", "blockB", "blockC", "blockD", and "blockE". "blockA", "blockB", "blockC", "blockD", and "blockE" are the block identification information. The connection relationships in the circuit 5 are represented by the connection information included in the netlist 42.

In the following, in each of the embodiments, input data used in the process and the process flow by the abstraction level selection part 110 are illustrated.

Embodiment 1

Figure 6B:
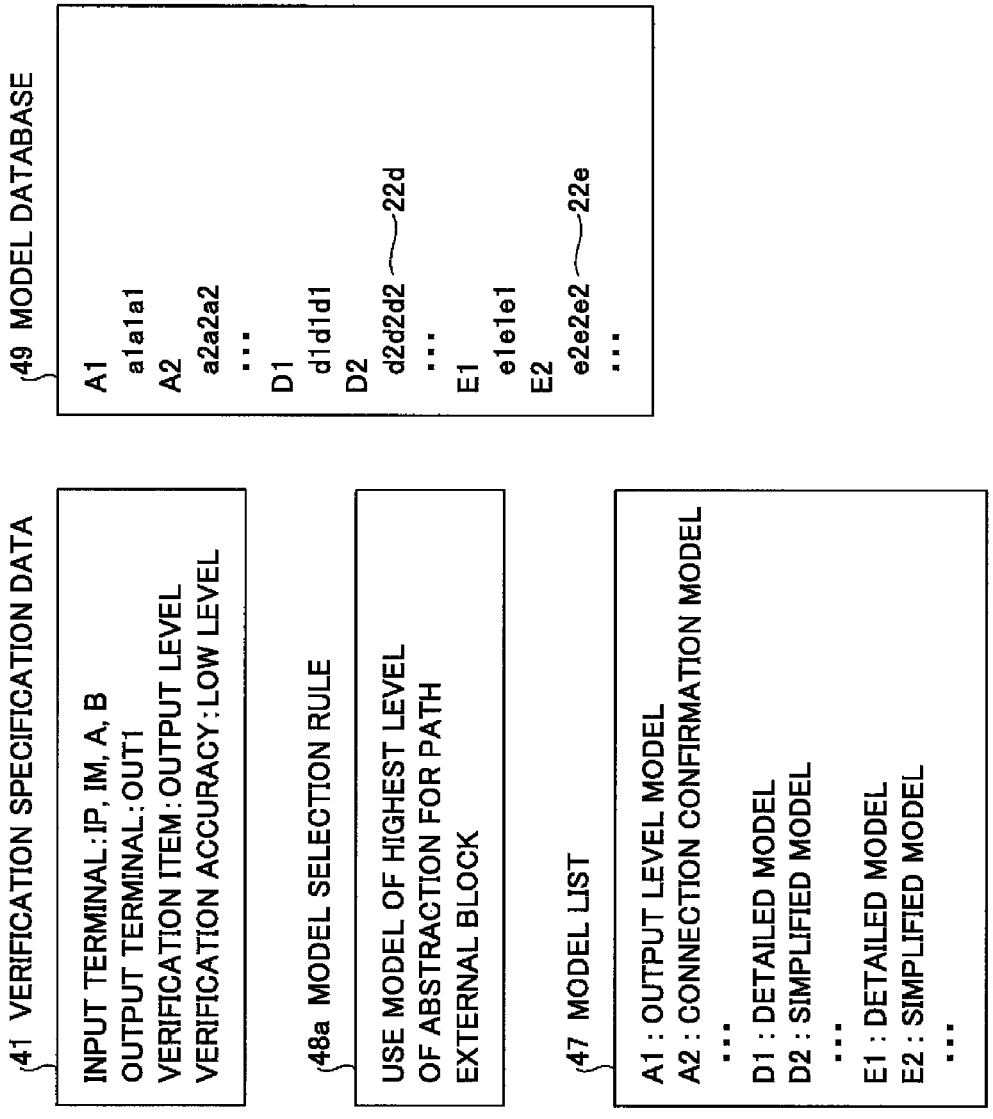

The embodiment 1 corresponds to a case of changing the out-of-path blocks to a model of the highest level. FIG. 6A and FIG. 6B are diagrams illustrating examples of the input data according to the embodiment 1. As illustrated in FIG. 6A and FIG. 6B, the netlist 42, the verification specification data 41, a model selection rule 48a, a model list 47, and the model database 49 are input as the input data into the abstraction level selection part 110 of the design verification apparatus 100.

In FIG. 6A and FIG. 6B, the verification specification data 41 includes items of the input terminal, the output terminal, the verification item, the verification accuracy level, and the like. In FIG. 6A and FIG. 6B, the input terminals "IP", "IM", "A", and "B" are indicated, and the output terminal "OUT1" is indicated. Accordingly, the path from each of the input terminals "IP", "IM", "A", and "B" to the output terminal OUT1 is regarded as the verification target. Also, the verification item is intended to verify the output level, and the verification accuracy level is intended to verify the circuit 5 at a low level.

By referring to FIG. 6a, the netlist 42 includes a connection information part 43a, and a model description part 43b. In the connection information part 43a, the connection information is defined to indicate the connection relationship for each of the blocks forming the circuit 5. In the model description part 43b, inputs and outputs are defined for each of the blocks, and an operation of each of the blocks is represented in a hardware description language.

In the connection information part 43a illustrated in FIG. 6A, connection information I0 43a-2 defines the inputs and the output related to the "blockA" by indicating "IP", "IM", and "oa". In the module description part 43b, (IP IM oa) corresponds to a description (in1 in2 out) by a model description "Model blockA" 43b-2 for the block "blockA". The terminals "IP" and "IM" are defined as the inputs of the "blockA", and the terminal "oa" is defined as the output of the "blockA". The model description part 43b further describes the operation concerning the "blockA" in an "aaaaaa" portion in the hardware description language. In the following, the "aaaaaa" portion, which does not include a description portion defining the inputs and the outputs, is called an operation description part. Other blocks in the circuit 5 are described in the same manner.

The model selection rule 48a illustrated in FIG. 6B regulates a rule for selecting the model having the highest abstraction level for the out-of-path blocks in the blocks which are classified by using a result of the path search process.

The model list 47 (FIG. 6B) is associated with the model database 49 with the model identification information, and is regarded as data indicating the verification purpose or the verification accuracy level for each of the models with respect to operation description data managed by the model database 49 (which exist in the model data base 49).

In this example, the model identification information specifies the block by a capital letter, and is indicated in a format used to identify each of the multiple models for the same block by a numeral. Multiple models A1, A2, . . . correspond to the "blockA". The model database 49 includes the operation description data corresponding to each of the verification purposes such that the model A1 is used as an "output level model" for verifying the output level, the model A2 is used as a "connection confirmation model" for confirming connections, and the like.

In other examples, multiple models D1, D2, . . . and the like correspond to the "blockD". The model database 49 includes the operation description data corresponding to each of the verification accuracy levels such that the model D1 is used as the "detailed model", the model D2 is used as the "simplified model", and the like. In the verification accuracy levels, the "detailed model" indicates a model of the highest abstraction level, and the "simplified model" indicates a model of the lowest abstraction level.

The model database 49 illustrated in FIG. 6B manages the operation description data which are described in the hardware description language and represent operation contents corresponding to the verification purpose or the verification accuracy level, for the model identification information, such as "a1a1a1" for the model A1, "a2a2a2" for the model A2, . . . , "d1d1d1" for the model D1, "d2d2d2" for the model D2, . . . , and the like.

Figure 7A:
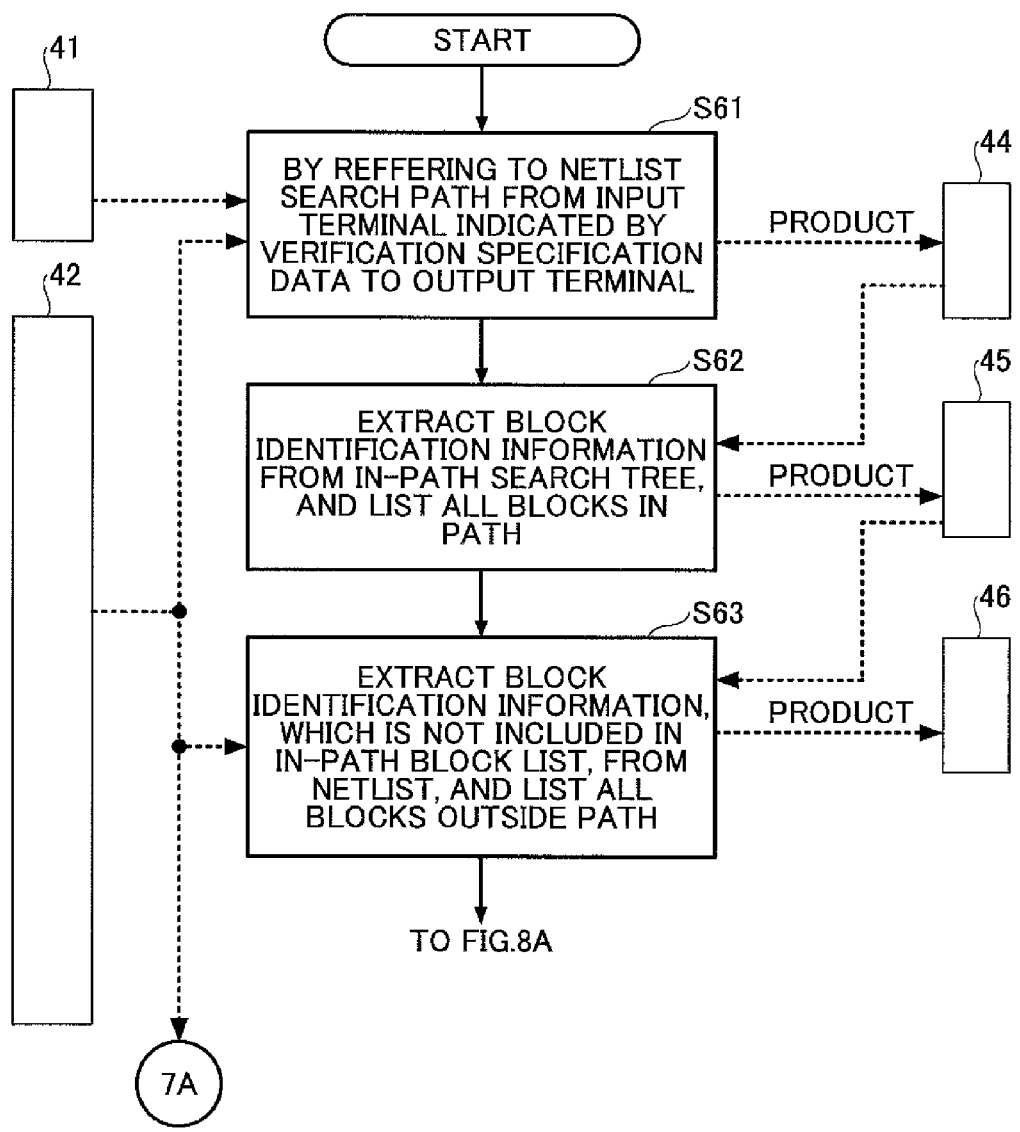
FIG. 7A is a flowchart for explaining an abstraction level selection process in the embodiment 1 (part 1)
Figure 7C:
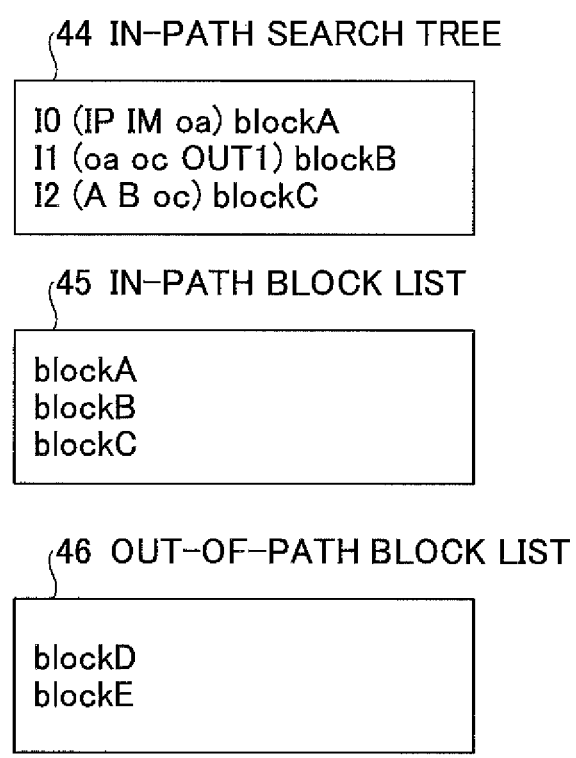
FIG. 7C illustrates data generated in the abstraction level selection process (part 1)
Figure 8A:
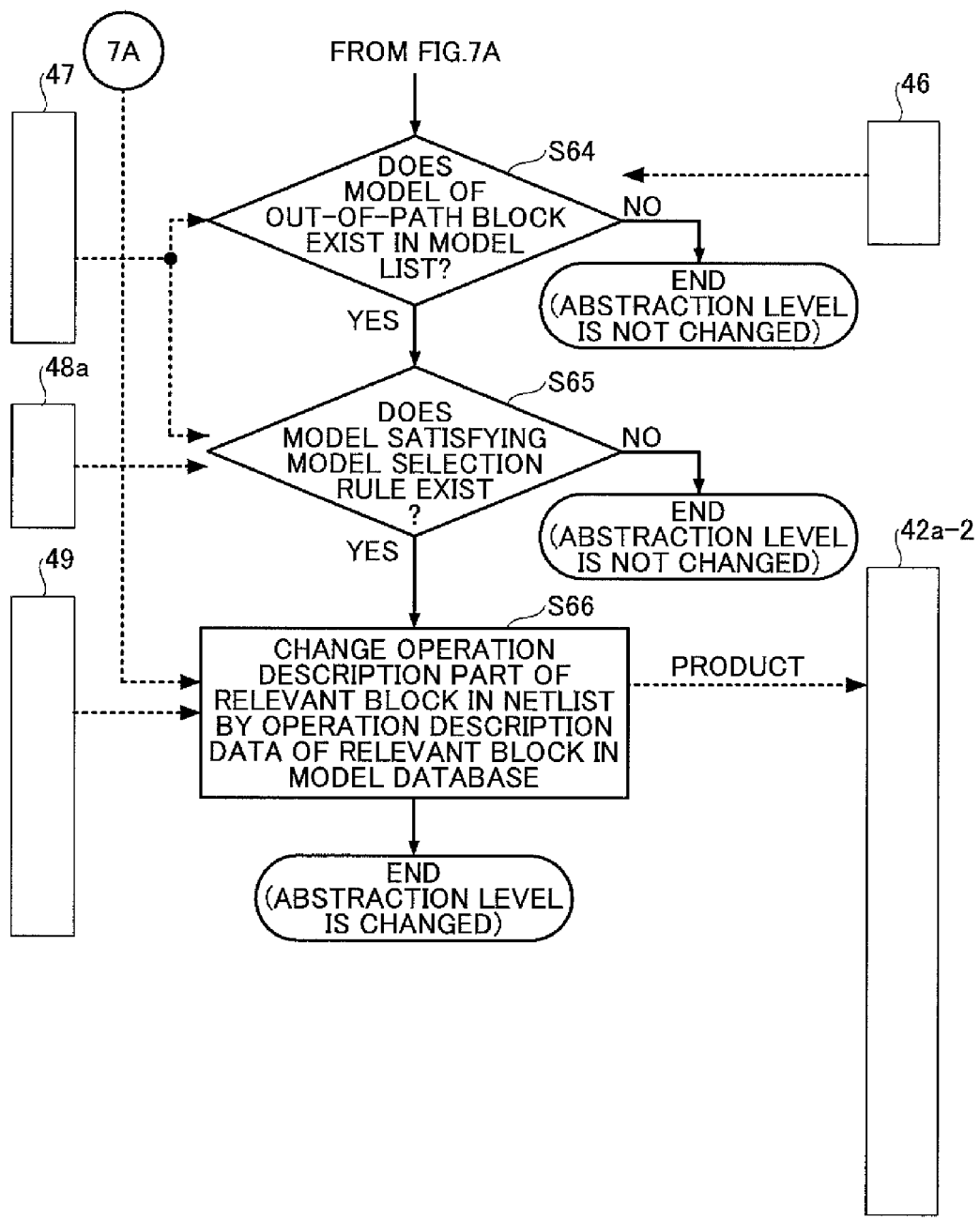
FIG. 8A is a flowchart for explaining the abstraction level selection process in the embodiment 1 (part 2)
Figure 8C:
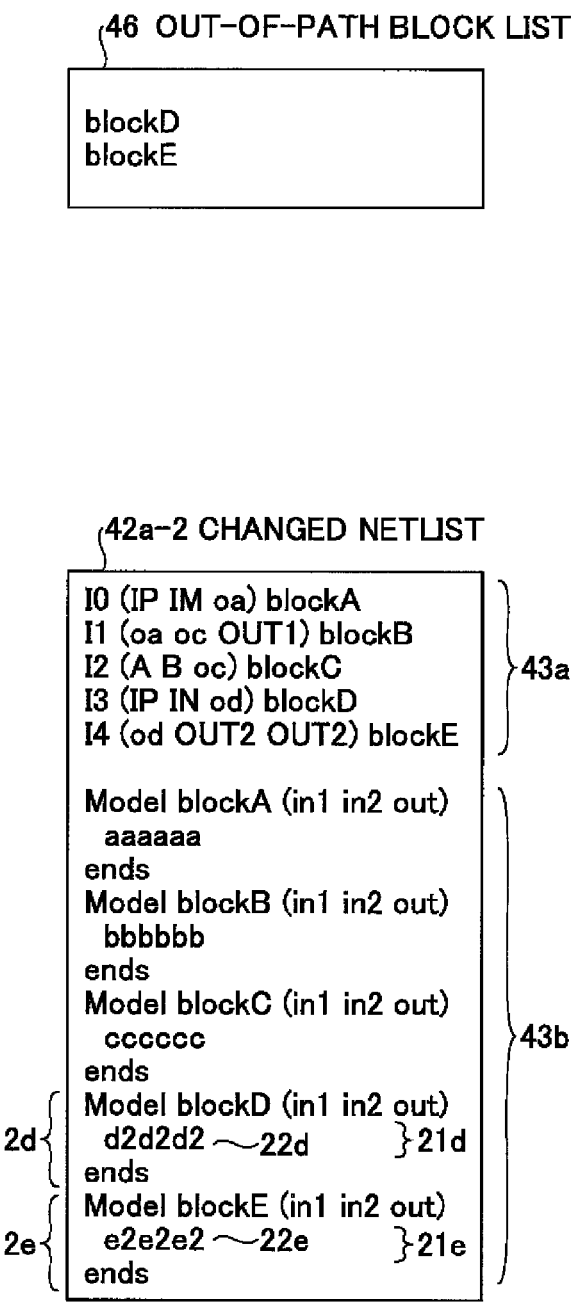
FIG. 8C illustrates data generated in the abstraction level selection process (part 2)

FIG. 7A is a flowchart for explaining the abstraction level selection process in the embodiment 1 (part 1), FIG. 7B illustrates data referred to in the abstraction level selection process in the embodiment 1 (part 1), and FIG. 7C illustrates data generated in the abstraction level selection process (part 1). FIG. 8A is a flowchart for explaining the abstraction level selection process in the embodiment 1 (part 2), FIG. 8B illustrates data referred to in the abstraction level selection process in the embodiment 1 (part 2), and FIG. 8C illustrates data generated in the abstraction level selection process (part 2).

In FIG. 7A, the path search process part 112 searches for the path between the input terminals and the output terminals which are indicated by the verification specification data 41, by referring to the netlist 42 (FIG. 7B) (step S61). By this path search, the paths are searched for from each of the input terminals "IP", "IM", "A", and "B" to the output terminal OUT1, the in-path search tree 44 (FIG. 7C) is generated. In the embodiment 1, the "blockA", the "blockB", and the "blockC" are searched for. At least, the in-path search tree 44 stores connection information I0, I1, and I2 each indicating the block identification information for identifying each of the blocks being searched, and the connection information between the blocks. In FIG. 7C, the connection information I0, I1, and I2 are exemplified for the in-path search tree 44 in response to data example of the netlist 42 (FIG. 7A). However, a data format is not limited to that illustrated for the in-path search tree 44.

When the path search is terminated, the block classification process part 113 extracts the block identification information from the in-path search tree 44 stored in the storage part 40, and creates a list of all blocks in the path based on the verification specification data 41 (step S62). The in-path block list 45 (FIG. 7C), which lists all blocks in the path based on the verification specification data 41, is generated and stored in the storage part 40. In the in-path block list 45 (FIG. 7C) in the embodiment 1, the "blockA", the "blockB", and the "blockC" are recorded as the block identification information.

Moreover, the block classification process part 113 extracts the block identification information which is not included in the in-path block list 45 (FIG. 7C), from the netlist 42 (FIG. 7B) (step S63). The out-of-path block list 46 (FIG. 7C), in which all blocks outside the path are listed based on the verification specification data 41, is generated and stored in the storage part 40. The "blockD" and the "blockE" are recorded as the block identification information in the out-of-path block list 46 (FIG. 7C) in the embodiment 1.

Referring to FIG. 8A, after the block classification process part 113 classifies the blocks into the in-path blocks and the out-of-path blocks based on the verification specification data 41, the model selection process part 114 determines whether or not there is the model of the out-of-path block in the model list 47 (FIG. 8B) (step S64).

In the input data examples for the embodiment 1, it may be determined whether or not the model identification information including the capital letter which is uniquely given to each of the blocks exists in the model list 47. "D1" and "D2" as the model identification information, which includes a capital letter "D" for the "blockD" listed in the out-of-path block list 46 (FIG. 8C), exist in the model list 47 (FIG. 8B). Also, "E1" and "E2" as the model identification information, which includes a capital letter "E" for the "blockE" listed in the out-of-path block list 46 (FIG. 8C), exist in the model list 47 (FIG. 8B). In this case, it is determined that there is the model of the out-of-path block. The model selection process part 114 advances to step S65.

On the other hand, in step S64, when it is determined that there is the model of the out-of-path block, information indicating that "the abstraction level is not changed" is set as a result of the abstraction level selection process, and the abstraction level selection process is terminated. In this case, the simulation part 120 carries out the simulation by using the netlist 42 in which the operation description part for the blocks is not changed.

When it is determined that there is the model of the out-of-path block, the model selection process part 114 further determines whether or not the model satisfying the model selection rule 48a exists (step S65).

In a case of the model selection rule 48a in the embodiment 1, the model selection process part 114 determines, by referring to the model list 47, whether or not the model having the highest abstraction level exist for each of the blocks with respect to the models ("D1", "D2", "E1", and "E2" as the model identification information) in which presences of the models are confirmed in the step S64. In the embodiment 1, it is determined that the model "D2" for the "blockD" and the model "E2" for the "blockE" satisfies the model selection rule 48a. Then, the model "D2" and the model "E2" are selected.

On the other hand, in step S65, when it is determined that the model satisfying the model selection rule 48a does not exist, information indicating that "the abstraction level is not changed" is set as a result of the abstraction level selection process, and the abstraction level selection process is terminated. In this case, the simulation part 120 performs the simulation using the netlist 42 in which the operation description part of the block is not changed.

When the model satisfying the model selection rule 48a is selected as illustrated in the embodiment 1, the model selection process part 114 changes the operation description part in a model description of the block concerning the model in the netlist 42, with the selected operation description data (step S66).

In the embodiment 1, the models "D2" and "E2" are selected for the "blockD" and the "blockE". Accordingly, the model selection process part 114 changes an operation description part 21d in a model description 2d of the "blockD" and an operation description part 21e in a model description 2e of the "blockE" in the model description part 43b of the netlist 42, respectively, by the operation description data 22d of the model "D2" and the operation description data 22e of the model "E2" which are managed in the model database 49, so as to generate the changed netlist 42a-2. The changed netlist 42a-2 is stored in the storage part 40. The operation description part 21d is changed from "dddddd" to "d2d2d2", and the operation description part 21e is changed from "eeeeee" to "e2e2e2".

Since the netlist 42 is changed by the model selection process part 114, information indicating that "the abstraction level is changed" is set as a result of the abstraction level selection process. In this case, the simulation part 120 performs the simulation by using the changed netlist 42a-2 in which the operation description part of the block is changed.

Figure 9:
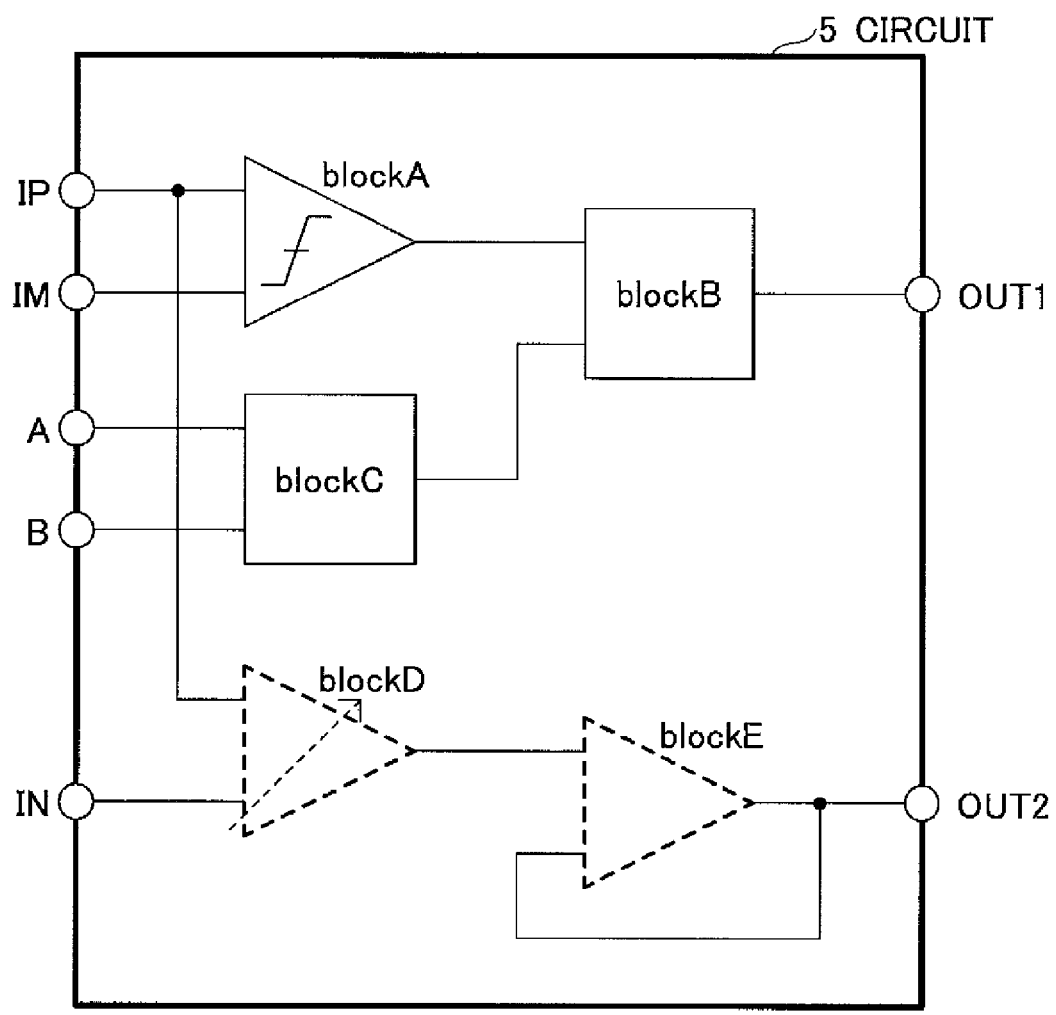
FIG. 9 is a diagram illustrating a configuration in which the abstraction levels of blocks are changed in the embodiment 1.

By performing the abstraction level selection process illustrated in FIG. 7A and FIG. 8A in the embodiment 1, the circuit 5 illustrated in FIG. 5 may be represented based on the changed netlist 42a-2 as illustrated in FIG. 9. FIG. 9 is a diagram illustrating a configuration in which the abstraction levels of the blocks are changed in the embodiment 1. In FIG. 9, the "blockD" and the "blockE", which are changed by the operation description data of the highest abstraction level in the abstraction level selection process in the embodiment 1, are depicted by dashed lines. Also, the "blockA", the "blockB", and the "blockC", in which the abstraction levels are not changed, are indicated by solid lines.

As described above, in the embodiment 1, the abstraction level of the operation description part of the block, which is determined as the out-of-path block based on the verification specification data 41, is changed to be the highest abstraction level. Therefore, when the simulation is performed, it is possible to simplify the operation of the block, which does not directly influence the verification contents of the operation of the circuit 5. It is possible to conduct a verification process at a higher speed. In the embodiment 1, the block, which is determined that the block is in the path, is not simplified. Therefore, it is possible to acquire an appropriate verification result concerning a designed portion being a target of the verification contents.

Embodiment 2

Figure 10B:
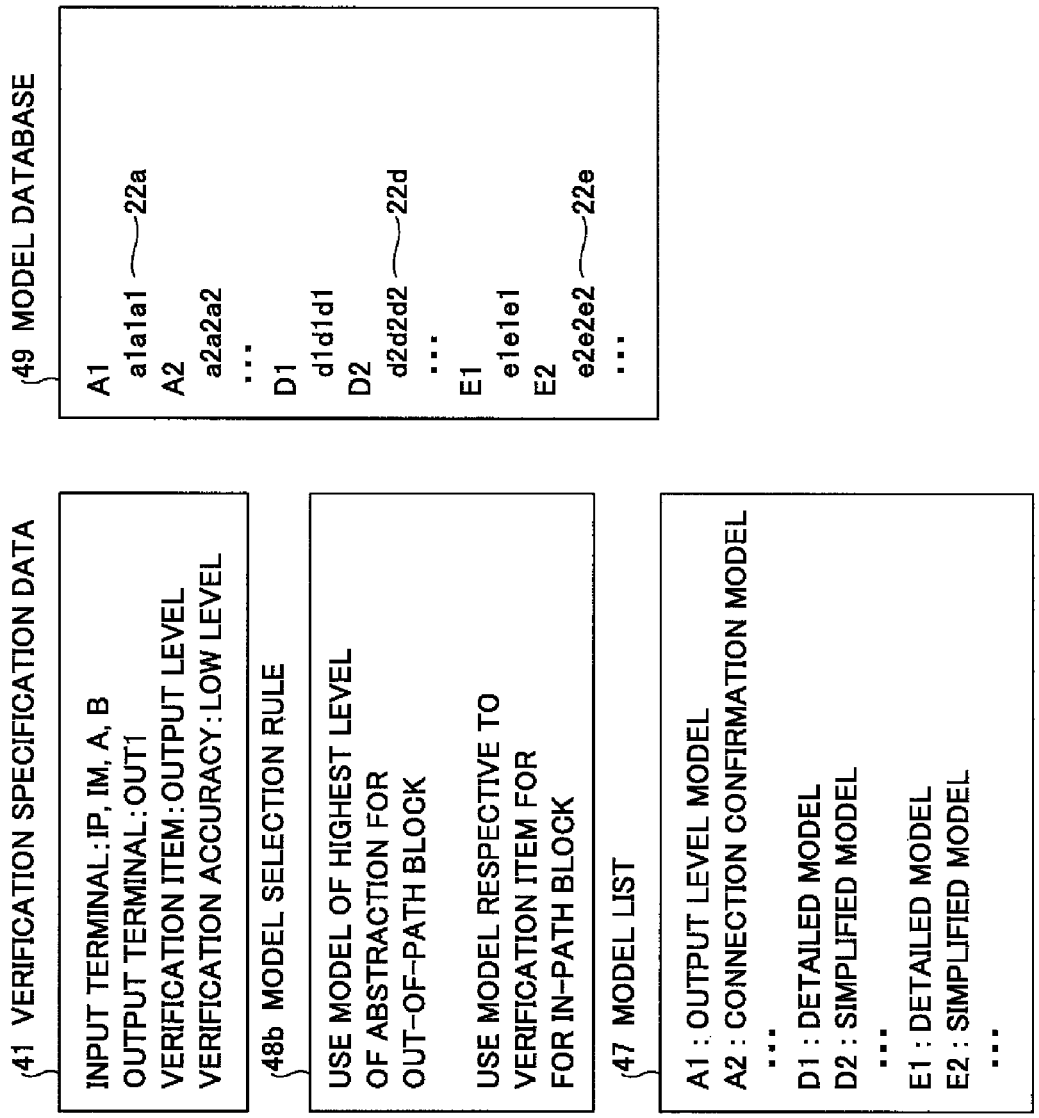

An embodiment 2 corresponds to a case in which the out-of-path block is changed by the model of the highest abstraction level and the in-path block is changed by the model corresponding to the verification item. FIG. 10A and FIG. 10B are diagrams illustrating examples of input data according to the embodiment 2. As illustrated in FIG. 10A and FIG. 10B, the netlist 42, the verification specification data 41, the model selection rule 48b, the model list 47, and the model database 49 are input to the abstraction level selection part 110 of the design verification apparatus 100 as input data.

In FIG. 10A and FIG. 10B, the data examples of the verification specification data 41, the netlist 42, the model list 47, and the model database 49 are the same as the data examples illustrated in FIG. 9, and the explanations thereof will be omitted.

The model selection rule 48b in the embodiment 2 indicates a rule regulating the models of the out-of-path block and the in-path block. The model selection rule 48b illustrated in FIG. 10B regulates that the model of the highest abstraction level is used for the out-of-path block and the model respective to the verification item is used for the in-path block.

Figure 11A:
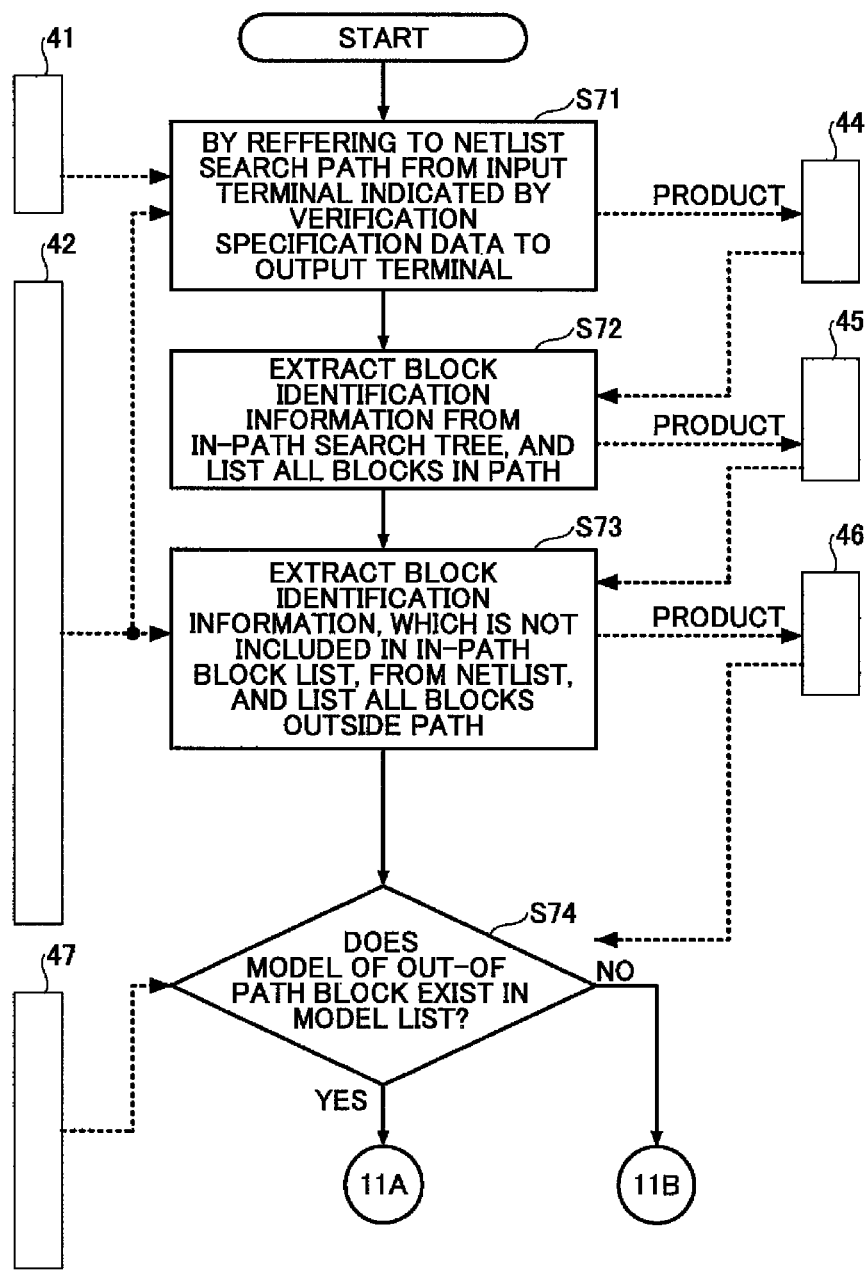
FIG. 11A is a flowchart for explaining the abstraction level selection process in the embodiment 2 (part 1)
Figure 12A:
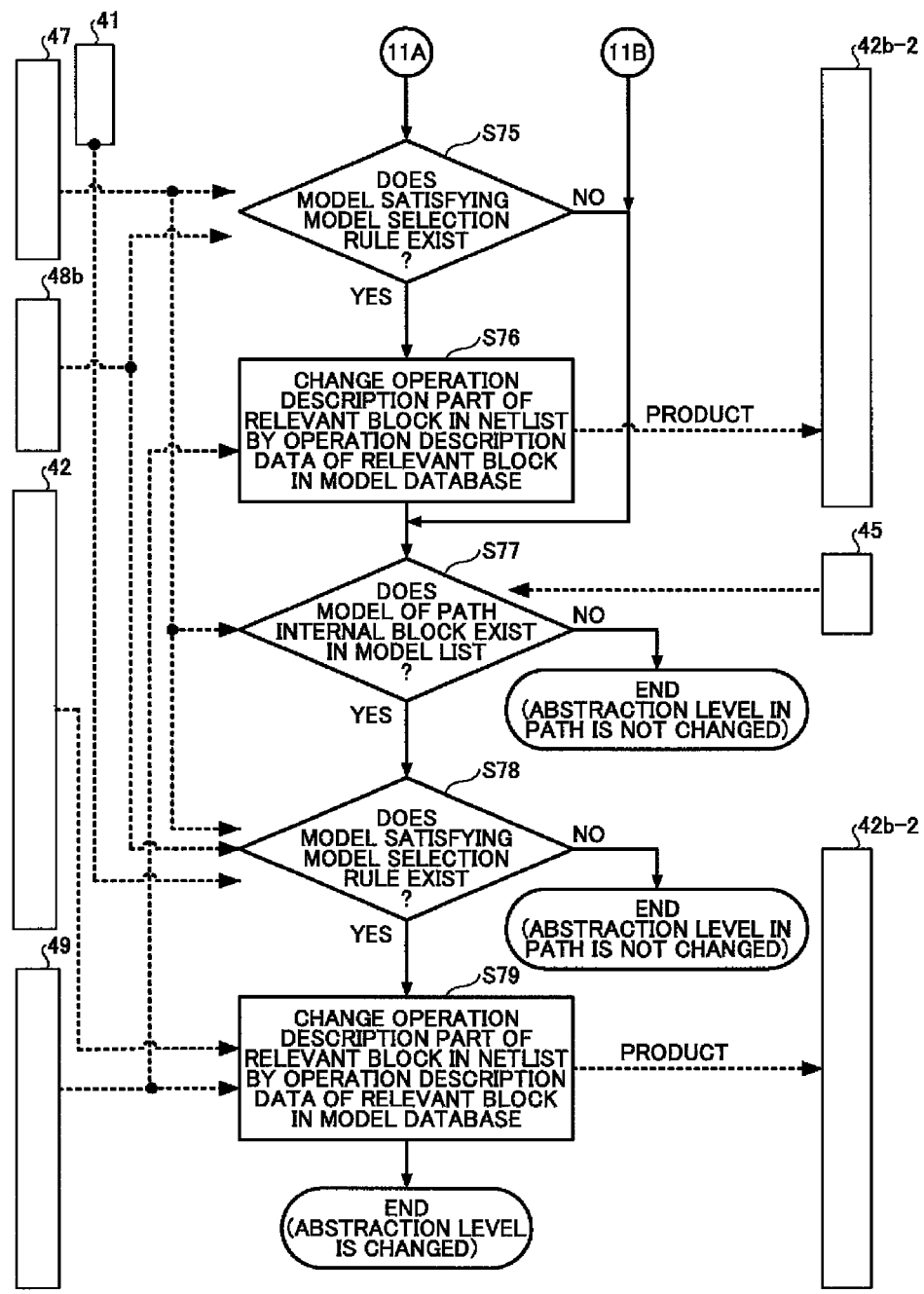
FIG. 12A is a flowchart for explaining the abstraction level selection process in the embodiment 2 (part 2)

The abstraction level selection process in the embodiment 2, which will be described with reference to FIG. 11A and FIG. 12A, is performed for the input data. In the model description part 43b of the netlist 42, an operation description part 21a in the model description 2a, an operation description part 21d in the model description 2d, and an operation description part 21e in the model description 2e are changed into operation description data 22a of the model database 49, the operation description data 22d, and the operation description data 22e, respectively.

Figure 12B:
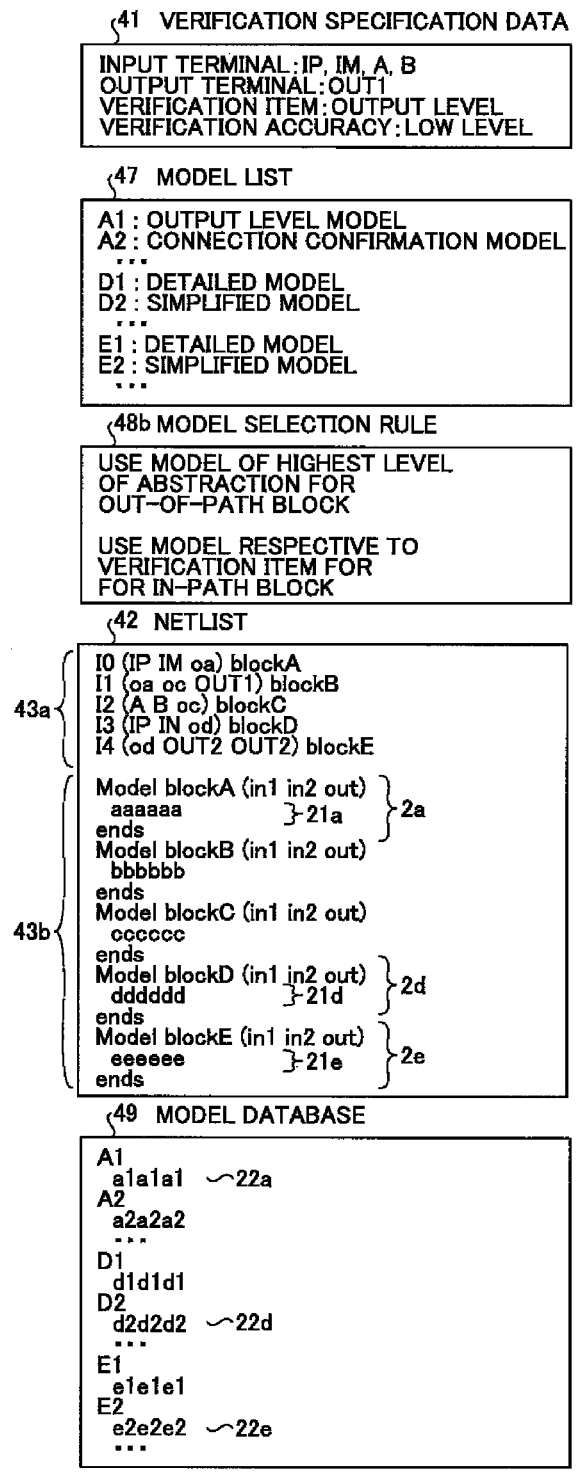
FIG. 12B is a diagram illustrating examples of input data for the abstraction level selection process in the embodiment 2 in FIG. 12A (part 2)

FIG. 11A is a flowchart for explaining the abstraction level selection process in the embodiment 2 (part 1), FIG. 11B is a diagram illustrating examples of input data for the abstraction level selection process in the embodiment 2 in FIG. 11A (part 1), and FIG. 11C is a diagram illustrating data examples generated in the abstraction level selection process in the embodiment 2 in FIG. 11A (part 1). FIG. 12A is a flowchart for explaining the abstraction level selection process in the embodiment 2 (part 2), FIG. 12B is a diagram illustrating examples of input data for the abstraction level selection process in the embodiment 2 in FIG. 12A (part 2), and FIG. 12C is a diagram illustrating data examples generated in the abstraction level selection process in the embodiment 2 in FIG. 12A (part 2).

In FIG. 11A, the path search process by the path search process part 112 in step S71 corresponds to that in step S61 illustrated in FIG. 7A in the embodiment 1. The block classification process by the block classification process part 113 in steps S72 and S73 corresponds to that in steps S62 and S63. In step S71, the netlist 42 and the verification specification data 41 (FIG. 11B) are referred to, and the in-path search tree 44 (FIG. 11C) is generated as a product. In step S72, the in-path block list 45 (FIG. 11C) is generated as a product. In step S73, the model list 47 (FIG. 11B) is referred to and the out-of-path block list 46 is generated as a product in step S73.

When the blocks are classified into the in-path block and the out-of-path block based on the verification specification data 41 by the block classification process part 113, the model selection process part 114 determines whether there is the model of the out-of-path block in the model list 47 (step S74). A determination method is the same as that in step S64 in FIG. 8A in the embodiment 1, and the explanation thereof will be omitted.

In step S74, when it is determined that there is no model of the out-of-path block, the model selection process part 114 advances to step S77.

On the other hand, when it is determined that there is the model of the out-of-path block, in FIG. 12A, the model selection process part 114 further determines whether there is the model satisfying the model selection rule 48b (step S75). When it is determined that there is no model satisfying the model selection rule 48b, the model selection process part 114 advances to step S77.

In a case of the model selection rule 48b in the embodiment 2, for the models (the model identification information "D1", "D2", "E1", and "E2") which are confirmed in step S74, the model selection process part 114 determines whether there is the model of the higher abstraction level for each of the blocks, by referring to the model list 47. In this example, the models "D2" and "E2" are determined to satisfy the model selection rule 48b, and are selected for the "blockD" and the "blockE", respectively. After that, the model selection process part 114 changes the operation description part in the model description of a respective block of the netlist 42 by operation description data of the selected models (step S76).

In the embodiment 2, the model selection process part 114 generates the changed netlist 42b-2 by changing the operation description part 21d in the model description 2d of the "blockD" and the operation description part 21e in the model description 2e of the "blockE" by the operation description data 22d of the model "D2" and the operation description data 22e of the model "E2" which are managed in the database 49 (FIG. 12B), respectively, in the model description part 43b of the netlist 42 (FIG. 12B). The changed netlist 42b-2 is stored in the storage part 40. The operation description part 21d is changed from "dddddd" to "d2d2d2", and the operation description part 21e is changed from "eeeeee" to "e2e2e2".

Next, the model selection process part 114 determines whether there is the model of the in-path block in the model list 47 (FIG. 12B) (step S77). The model identification information "A1" and the model identification information "A2", each including a capital letter "A" of "blockA" listed in the in-path block list 45 (FIG. 12C), exist in the model list 47 (FIG. 12B). The model selection process part 114 determines that there is the model of the in-path block, and advances to step S78 in FIG. 12A.

On the other hand, in step S77, when it is determined that there is no model of the out-of-path block, a data indicating that "the abstraction level is not change in the path" is set as the result of the abstraction level selection process, and the abstraction level selection process is terminated. In this case, the simulation part 120 performs the simulation by using the netlist 42 (FIG. 12B) in which the operation description part of the block is not changed, since the changed netlist 42b-2 (FIG. 12C) does not exist in the storage part 40.

When it is determined that there is the model of the in-path block, the model selection process part 114 further determines whether there is the model satisfying the model selection rule 48b (step S78).

In a case of the model selection rule 48b (FIG. 12B) in the embodiment 2, the model selection process part 114 determines whether there is the model corresponding to the verification item for each of the blocks, with respect to the model (the model identification information "A1" and "A2") confirmed in step S74 by referring to the model list 47 (FIG. 12B). Based on "output level" as a verification item indicated by the verification specification data 41 (FIG. 12B). In this example, it is determined that the model "A1" of the "blockA" satisfies the model selection rule 48b, and the model "A1" is selected.

On the other hand, in step S78, when it is determined that there is no model satisfying the model selection rule 48b, data indicating that "the abstraction level is not changed in the path" is set as the result of the abstraction level selection process, and the abstraction level selection process is terminated. In this case, the simulation part 120 performs the simulation by using the netlist 42 (FIG. 12B) in which the operation description part of the block is not changed, since the changed netlist 42b-2 (FIG. 12C) does not exist in the storage part 40.

When the model satisfying the model selection rule 48b is selected as illustrated in the embodiment 2, the model selection process part 114 changes the operation description part in the model description of a respective block in the netlist 42 by the operation description data of the selected model (step S79).

In the embodiment 2, the models "D2" and "E2" are selected for the "blockD" and "blockE" in the out-of-path block, and the model "A1" is selected for the "blockA". Accordingly, the model selection process part 114 changes the operation description part 21a in the model description 2a of the "blockA", the operation description part 21d in the model description 2*d* of the "blockD", and the operation description part 21*e* in the model description 2*e* of the "blockE", by changing the operation description data 22*a* of the model "A1", the operation description data 22*d* of the model "D2", and the operation description data 22*e* of the model "E2" which are managed in the model database 49 (FIG. 12B), respectively. Thus, the changed netlist 42-2 (FIG. 12C) is generated and stored in the storage part 40. The operation description part 21*a* is changed from "aaaaaa" to "a1a1a1", the operation description part 21*d* is changed from "dddddd" to "d2d2d2", and the operation description part 21*e* is changed from "eeeeee" to "e2e2e2".

Since the netlist 42 (FIG. 12B) is changed by the model selection process part 114, data indicating that "the abstraction level is changed" is set as the result of the abstraction level selection process, and the abstraction level selection process is terminated. In this case, the simulation part 120 performs the simulation by using the changed netlist 42*b*-2 in which the operation description part of the block is changed.

Figure 13:
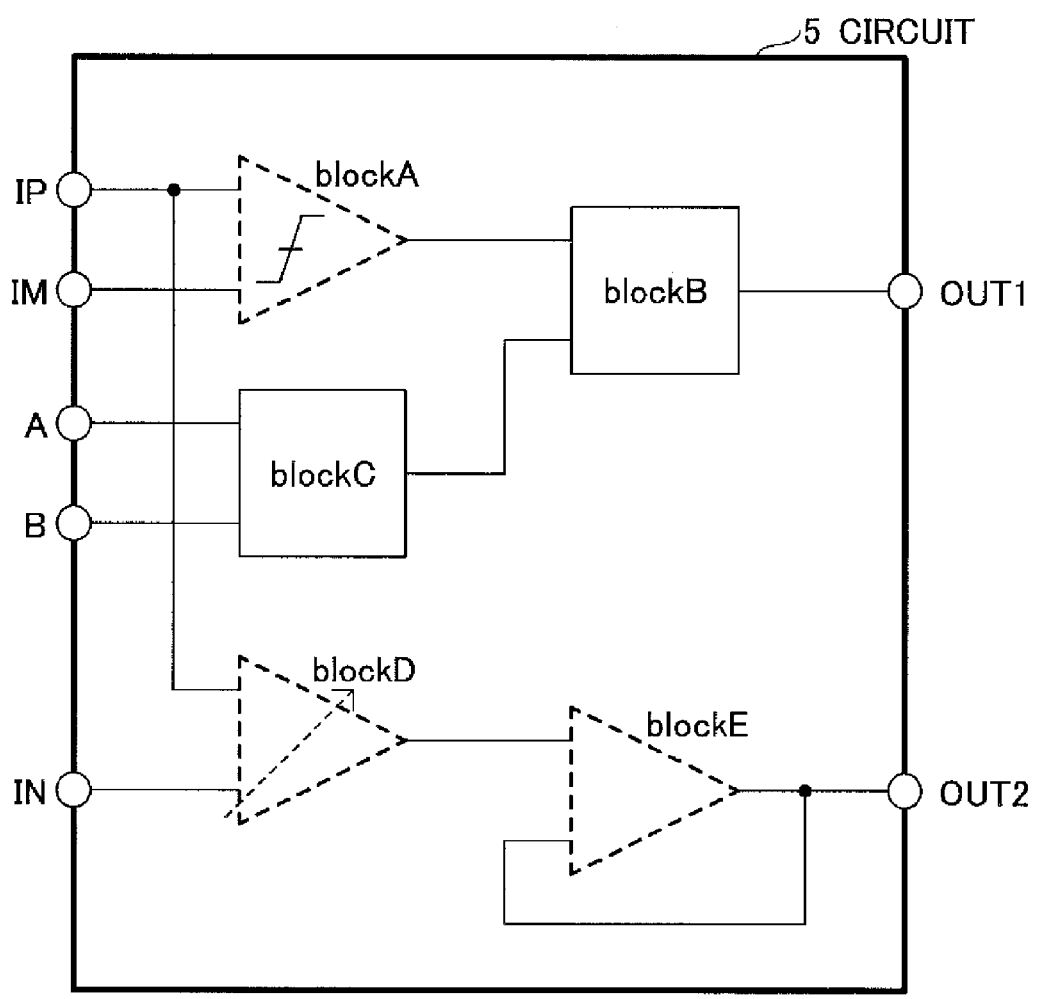
FIG. 13 is a diagram illustrating a configuration in which the abstraction levels of the blocks are changed in the embodiment 2.

As the result from performing the abstraction level selection process in the embodiment 2 illustrated in FIG. 11A and FIG. 12A, the circuit 5 illustrated in FIG. 5 may be represented based on the changed netlist 42*a*-2 as illustrated in FIG. 13. FIG. 13 is a diagram illustrating a configuration in which the abstraction levels of the blocks are changed in the embodiment 2. In FIG. 13, by the abstraction level selection process in the embodiment 2, the "blockD" and the "blockE", which are the out-of-path blocks and changed by the operation description data of the highest abstraction level, are depicted by dashed lines. Also, the "blockA", which is the in-path block and is changed by the operation description data corresponding to the "output level" indicated as the verification item, is depicted by a dashed line. On the other hand, the "blockB" and the "blockC", in which the abstraction levels are not changed, are depicted by solid lines.

As described above, in the embodiment 2, in a case in which the simulation is performed by changing the abstraction level of the operation description block, which is determined as the out-of-path block based on the verification specification data 41 (FIG. 11B and FIG. 12B), to the highest abstraction level, it is possible to simplify the operations of the blocks which do not directly influence the verification contents of the operation of the circuit 5. Thus, it is possible to realize the verification process at a higher speed. Also, it is possible to change the model corresponding to the verification item for the block determined as the in-path block. Accordingly, it is possible to acquire the adequate verification result for the verification item related to a designed portion to be a target of the verification contents.

Embodiment 3

Figure 14B:
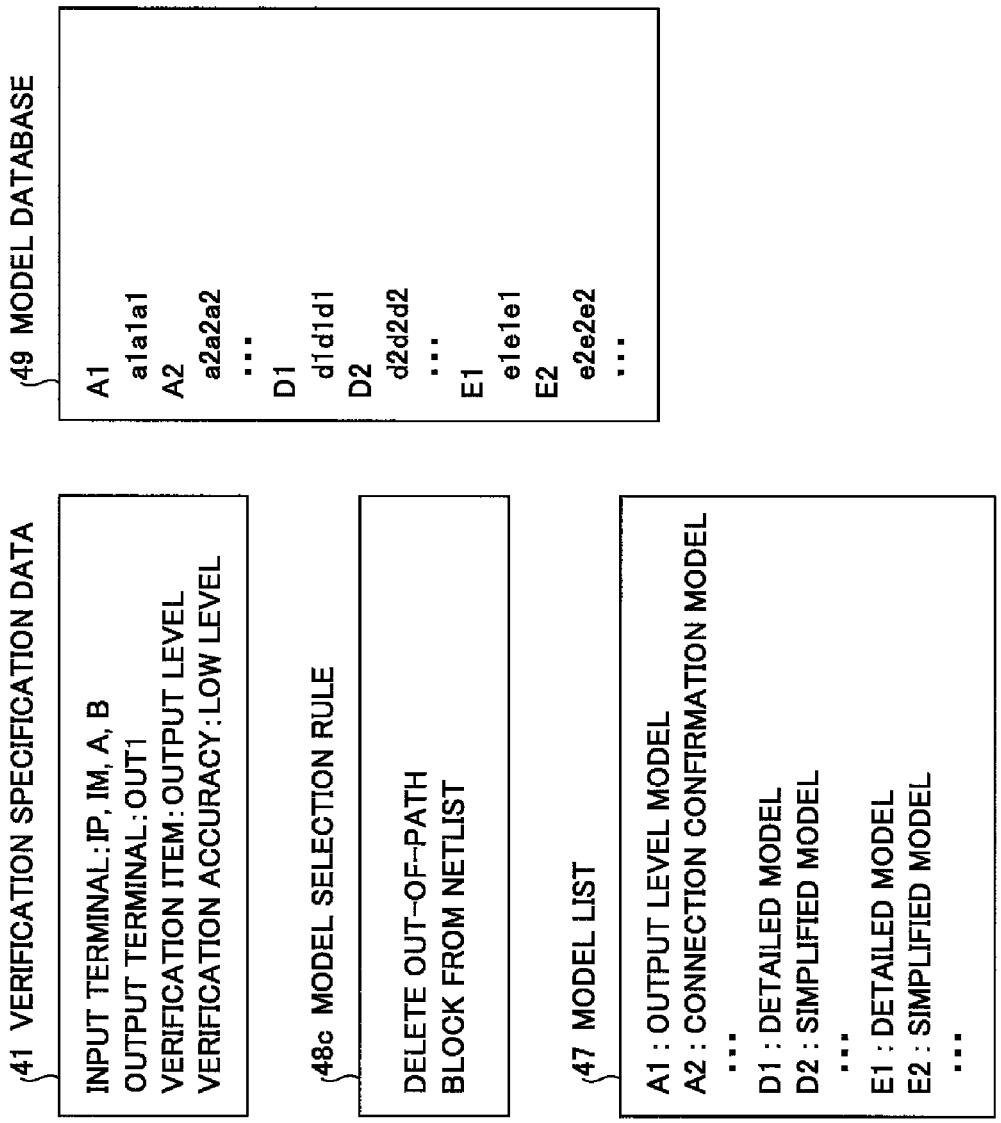

The embodiment 3 corresponds to a case of deleting the out-of-path block. FIG. 14A and FIG. 14B are diagrams illustrating examples of the input data according to the embodiment 3. As illustrated in FIG. 6, the netlist 42, the verification specification data 41, a model selection rule 48*c*, a model list 47, and the model database 49 are input as the input data into the abstraction level selection part 110 of the design verification apparatus 100.

The netlist 42, the verification specification data 41, the model list 47, the model selection rule 48*c*, and the model database 49 used in the embodiment 3 are illustrated in FIG. 14A and FIG. 14B. Data examples of the netlist 42, the verification specification data 41, the model list 47, and the model database 49 are the same as those in FIG. 10 in the embodiment 2, and the explanations thereof will be omitted.

The model selection rule 48*c* in the embodiment 3 indicates a rule regulating the models of the out-of-path block and the in-path block. The model selection rule 48*c* illustrated in FIG. 14B regulates that the out-of-path block is deleted from the netlist.

By performing the abstraction level selection process in the embodiment 3 using input data illustrated in FIG. 14A and FIG. 14B as described with reference to FIG. 15A, the model description 2*d* and the model description 2*e* are deleted in the model description part 43*b* of the netlist 42 (FIG. 14A).

Figure 15A:
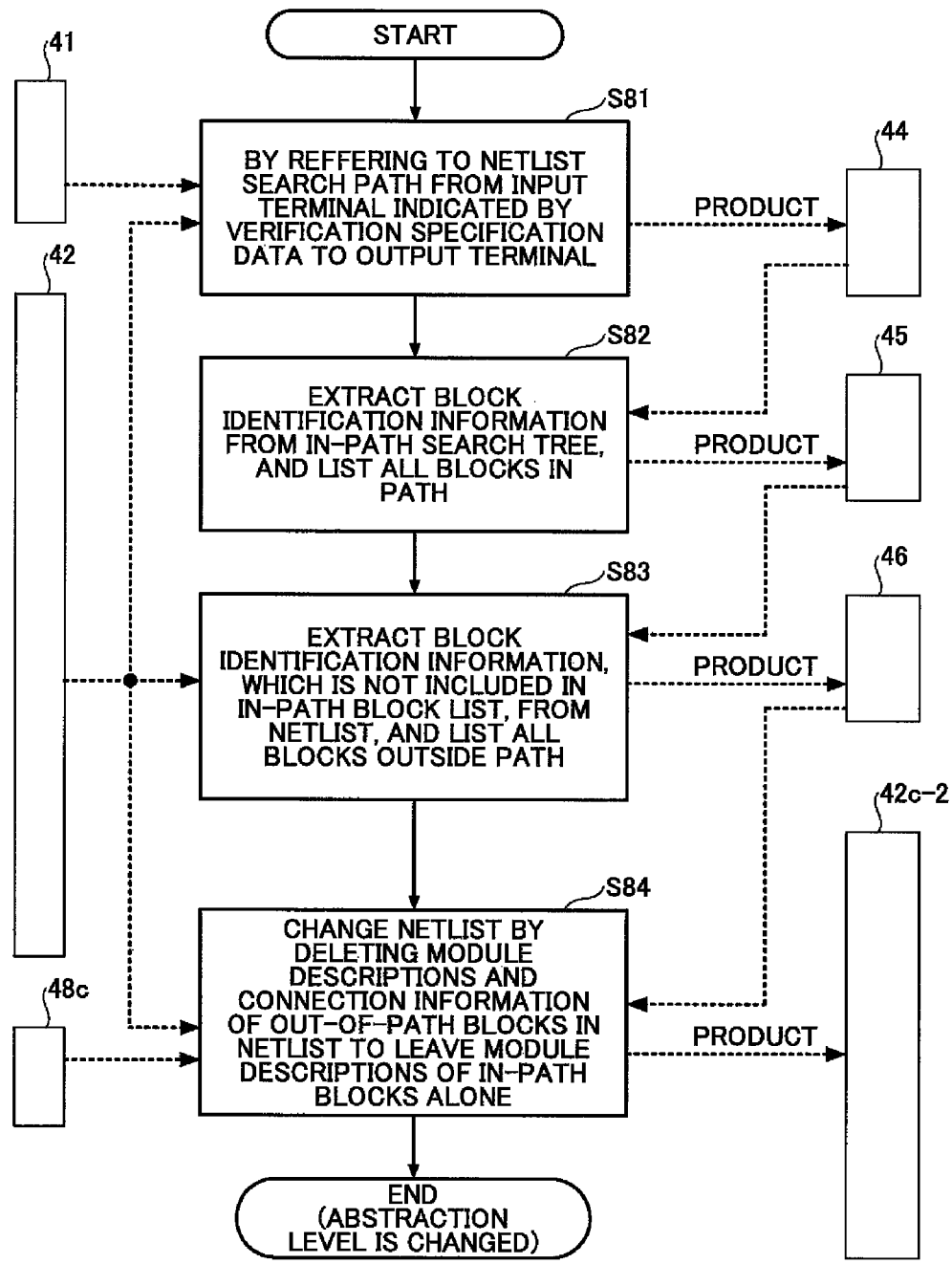
FIG. 15A is a flowchart for explaining the abstraction level selection process in the embodiment 1.
Figure 15C:
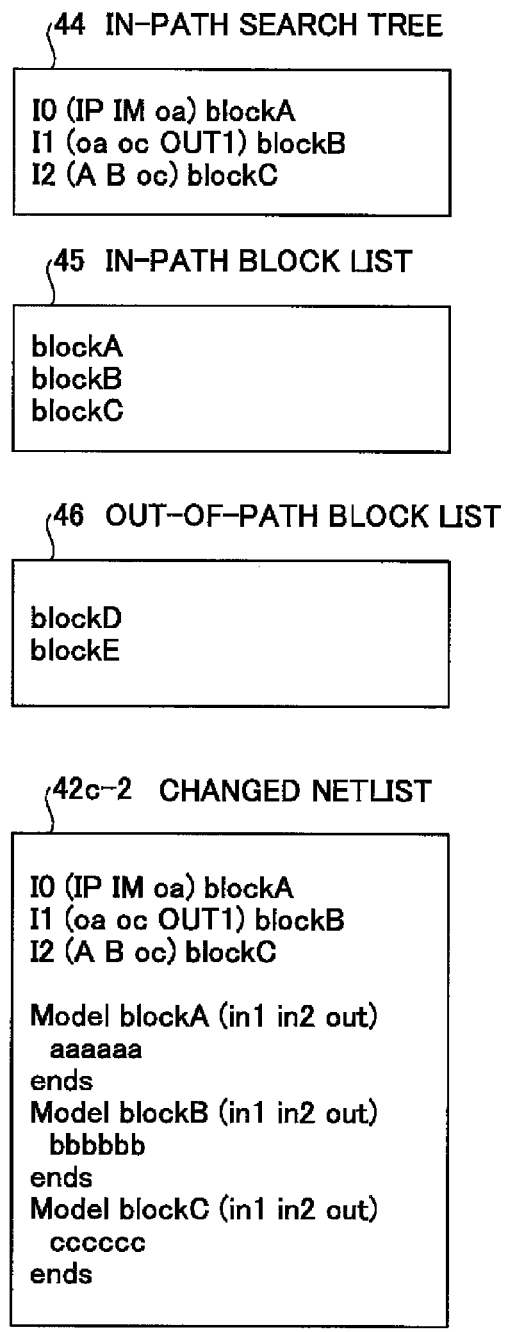
FIG. 15C illustrates data generated in the abstraction level selection process according to the embodiment 3.

FIG. 15A is a flowchart for explaining the abstraction level selection process in the embodiment 1, FIG. 15B illustrates data referred to in the abstraction level selection process in the embodiment 1, and FIG. 15C illustrates data generated in the abstraction level selection process. In FIG. 15A, a path search process by the path search process part 112 in step S81 corresponds to that in step S61 in FIG. 7A in the embodiment 1. Also, the block classification process by the block classification process part 113 in steps S82 and S83 corresponds to that in steps S62 and S63.

When completing a classification of the blocks into the in-path block and the out-of-path block based on the verification specification data 41 by the block classification process part 113, the model selection process part 114 deletes the module description and the connection information of the out-of-path block in the netlist 42 (FIG. 14A) in accordance with the model selection rule 48*c* (FIG. 14B), so as to leave descriptions of the in-path block (step S84).

In step S84, the model selection process part 114 acquires the "blockD" and the "blockE" as the block identification information by referring the out-of-path block list 46 (FIG. 15C) in order to delete the out-of-path block from the netlist 42 (FIG. 14A) in accordance with the model selection rule 48*c* (FIG. 14B). The model selection process part 114 generates the changed netlist 42*c*-2 (FIG. 15C) in which connection information 53 and the model description 2*d* specified by the "blockD" of the block identification information and connection information 54 and the model description 2*e* specified by the "blockE" of the block identification information are deleted from the netlist 42 (FIG. 15B). The changed netlist 42*c*-2 is generated and is stored in the storage part 40.

Figure 16:
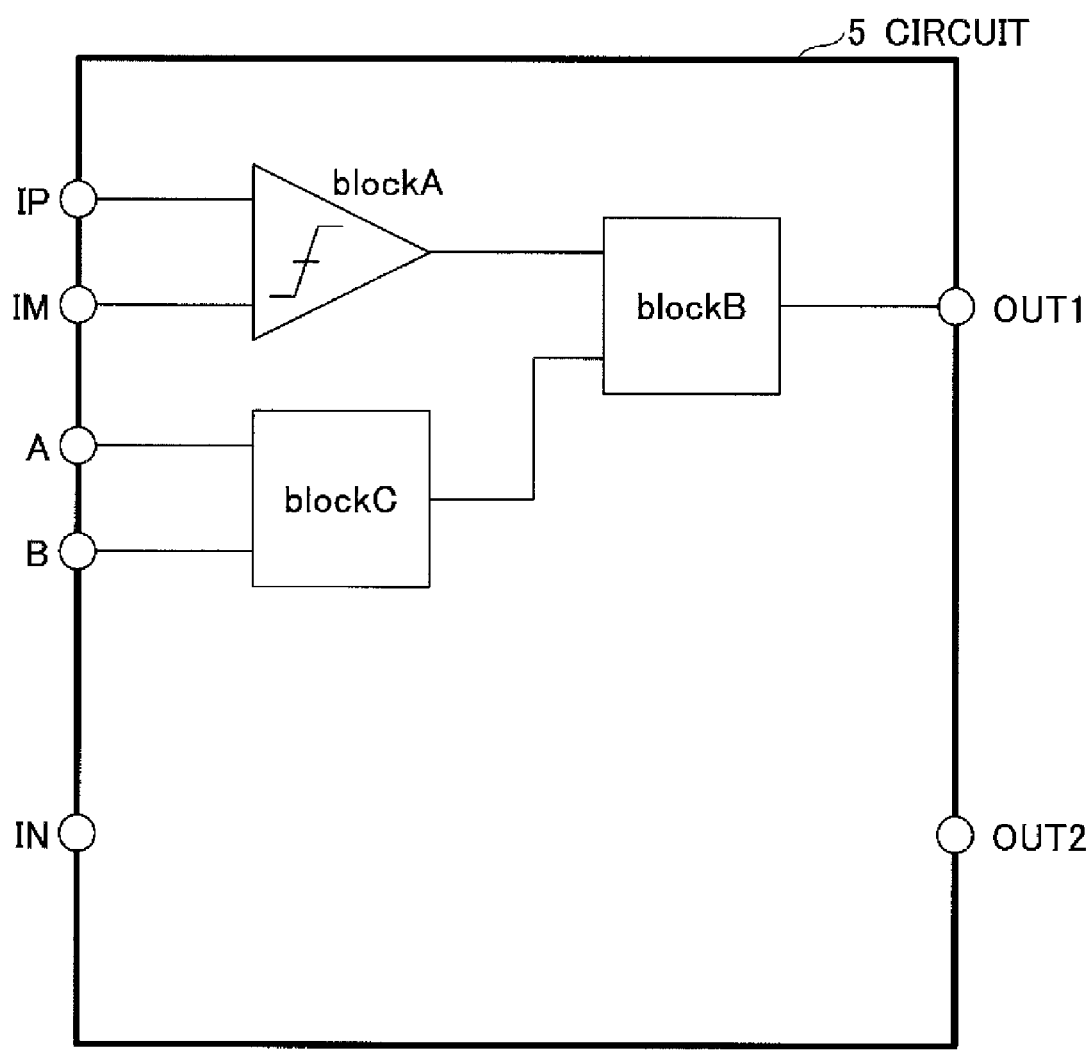
FIG. 16 is a diagram illustrating a configuration in which the abstraction levels of the blocks are changed in the embodiment 3.

By performing the abstraction level selection process in the embodiment 3 illustrated in FIG. 15A, the circuit 5 illustrated in FIG. 5 may be represented as illustrated in FIG. 16 based on the changed netlist 42*c*-2. FIG. 16 is a diagram illustrating a configuration in which the abstraction levels of the blocks are changed in the embodiment 3. In FIG. 16, the circuit 5 is indicated in a state in which the "blockD" and the "blockE" determined as the out-of-path blocks are deleted with the connection information in the abstraction level selection process in the embodiment 3.

As described above, in the embodiment 3, by deleting the model description and the connection information of the block determined as the out-of-path block based on the verification specification data 41, when the simulation is performed, an operation is suppressed in an area, which does not directly influence the verification contents of the operation of the circuit 5. It is possible to conduct the verification process at a high speed. Also, in this case, the model of the block determined as the in-path block is not simplified. Thus, it is possible to acquire an adequate verification result related to the design portion which is the target of the verification contents.

According to the embodiments 1 to 3, the path search in the circuit 5 is conducted in accordance with the verification specification data 41. Even if the circuit 5 is a large-scaled circuit, it is possible to adequately change the abstraction levels of the out-of-path block and/or the in-path block without omission.

Also, since the model of the block is selected in accordance with the model selection rule 48, it is possible to improve accuracy of a function and a feature of the block. Also, the model respective to the verification item is selected by referring to the verification specification data 41. It is possible to accurately and effectively conduct a verification concerning a specific function and feature.

Moreover, based on the path search in accordance with the verification specification data 41, it is possible to reduce simulation time by setting the model of the out-of-path block at least to be the detailed model in which the abstraction level is higher than the simplified model.

Furthermore, it is possible to prevent verification omissions. Thus, it is possible to reduce the simulation time and to reduce manpower for designing a circuit.

According to the above described embodiment, in the circuit verification, the operation of the block outside the path is changed to the model of the abstraction level higher than the operation by using the result of the path search in accordance with the verification specification. Therefore, it is possible to realize an appropriate simulation at high speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A design verification method performed in a computer, the method comprising:

searching for, by the computer, a path in accordance with a connection relationship between blocks by referring to a netlist stored in a storage part based on terminal information concerning a verification of a circuit which is formed by the blocks;

selecting, by the computer, first operation description data from multiple sets of operation description data describing, in different abstractions, an operation of an out-of-path block which is a block outside the path and is searched for from the blocks described in the netlist; and changing, by the computer, an abstraction level of the operation of the out-of-path block by replacing second operation description data described in the netlist with the first operation description data.

2. The design verification method as claimed in claim 1, wherein the operation of the out-of-path block in the netlist is changed by the first operation description data of a higher abstraction level than other operation description data by using a model database which is stored in the storage part and stores the first operation description data and the other operation description data describing the operation with abstraction levels respective to different verification accuracies related to the block.

3. The design verification method as claimed in claim 2, wherein the model database stores the multiple sets of operation description data describing operations respective to verification purposes related to the same block; and the computer further changes the operation of an in-path block which is a block in the path and is described in the netlist, with a set of operation description data describing the operation respective to a verification purpose by using the model database.

4. The design verification method as claimed in claim 3, further comprising:

classifying, by the computer, the multiple blocks into the in-path block and the out-of-path block by referring to the path being searched and the netlist.

5. The design verification method as claimed in claim 4, further comprising:

creating and storing, by the computer, an in-path block list which lists one or more in-path blocks being searched, in the storage part;

creating and storing, by the computer, an out-of-path block list which lists blocks excluded from the in-path block list, by referring to the netlist; and changing, by the computer, the abstraction level of the operation of the out-of-path block which is searched, the operation described in the netlist, by referring to the out-of-path block list stored in the storage part.

6. The design verification method as claimed in claim 1, wherein the first operation description data and connection information of the out-of-path bock are deleted from the netlist, to change the abstraction level of the operation of the out-of-path block to be higher than the description.

7. A non-transitory computer-readable recording medium storing a program which, when executed by a computer, causes the computer to perform a design verification process, the process comprising:

searching for a path in accordance with a connection relationship between blocks by referring to a netlist stored in a storage part based on terminal information concerning a verification of a circuit which is formed by the blocks;

selecting first operation description data from multiple sets of operation description data describing, in different abstractions, an operation of an out-of-path block which is a block outside the path and is searched for from the blocks described in the netlist; and changing an abstraction level of the operation of the out-of-path block by replacing second operation description data described in the netlist with the first operation description data.

8. A design verification apparatus, comprising:

a storage part configured to store a netlist in which a connection relationship between multiple blocks forming a circuit and an operation of each of the multiple blocks;

a searching part configured to search for a path in accordance with the connection relationship between the multiple blocks by referring to the netlist from the storage part based on terminal information concerning a verification of the circuit;

a selecting part configured to select first operation description data from multiple sets of operation description data describing, in different abstractions, an operation of an out-of-path block which is a block outside the path and is searched for from the blocks described in the netlist; and a changing part configured to change an abstraction level of the operation of the out-of-path block by replacing second operation description data described in the netlist with the first operation description data.

* * * * *